US012133382B2

(12) United States Patent
Yin

(10) Patent No.: US 12,133,382 B2
(45) Date of Patent: Oct. 29, 2024

(54) THREE-DIMENSIONAL MEMORY DEVICE WITH CONTACT VIA STRUCTURES LOCATED OVER SUPPORT PILLAR STRUCTURES AND METHOD OF MAKING THEREOF

(71) Applicant: SANDISK TECHNOLOGIES LLC, Addison, TX (US)

(72) Inventor: Xiang Yin, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 408 days.

(21) Appl. No.: 17/678,499

(22) Filed: Feb. 23, 2022

(65) Prior Publication Data

US 2023/0269936 A1 Aug. 24, 2023

(51) Int. Cl.

| | |
|---|---|
| ***H10B 41/27*** | (2023.01) |
| ***G11C 16/04*** | (2006.01) |
| ***H01L 23/522*** | (2006.01) |
| ***H10B 41/10*** | (2023.01) |
| ***H10B 41/35*** | (2023.01) |
| ***H10B 43/10*** | (2023.01) |
| ***H10B 43/27*** | (2023.01) |
| ***H10B 43/35*** | (2023.01) |

(52) U.S. Cl.

CPC ......... *H10B 41/27* (2023.02); *G11C 16/0483* (2013.01); *H01L 23/5226* (2013.01); *H10B 41/10* (2023.02); *H10B 41/35* (2023.02); *H10B 43/10* (2023.02); *H10B 43/27* (2023.02); *H10B 43/35* (2023.02)

(58) Field of Classification Search

None

See application file for complete search history.

(56) References Cited

U.S. PATENT DOCUMENTS 9,230,987 B2 1/2016 Pachamuthu et al.
9,412,749 B1 8/2016 Shimabukuro et al.
9,576,967 B1 2/2017 Kimura et al.

(Continued)

OTHER PUBLICATIONS

International Search Report and Written Opinion of the International Searching Authority for International Patent Application No. PCT/US2022/030425, mailed Aug. 31, 2022, 12 pages.

(Continued)

*Primary Examiner* — Bo B Jang

(74) *Attorney, Agent, or Firm* — THE MARBURY LAW GROUP PLLC

(57) ABSTRACT

An alternating stack of insulating layers and sacrificial material layers is formed over a substrate, and support pillar structures are formed through the alternating stack. Stepped surfaces are formed by patterning the alternating stack and the support pillar structures. A retro-stepped dielectric material portion is formed over the stepped surfaces. Memory openings and memory opening fill structures are formed through the alternating stack. Electrically conductive layers are formed by replacing at least the sacrificial material layers with at least one electrically conductive material. Contact via structures are formed through the retro-stepped dielectric material portion on the electrically conductive layers. A first support pillar structure is located directly below a first contact via structure.

3 Claims, 41 Drawing Sheets

200 300 100

762 761 758 770 10 720 730 730 750 752 754 756 9 7 700

(56) References Cited

U.S. PATENT DOCUMENTS

| | | | | |
|---|---|---|---|---|
| 9,659,956 | B1 | 5/2017 | Pachamuthu et al. | |
| 9,754,963 | B1 | 9/2017 | Kawamura et al. | |
| 9,853,038 | B1 | 12/2017 | Cui | |
| 9,881,929 | B1 | 1/2018 | Ravikirthi et al. | |
| 9,905,573 | B1 | 2/2018 | Mada et al. | |
| 9,978,766 | B1 | 5/2018 | Hosoda et al. | |
| 10,014,316 | B2 | 7/2018 | Yu et al. | |
| 10,115,632 | B1 | 10/2018 | Masamori et al. | |
| 10,141,331 | B1 | 11/2018 | Susuki et al. | |
| 10,192,784 | B1 | 1/2019 | Cui et al. | |
| 10,256,245 | B2 | 4/2019 | Ariyoshi | |
| 10,269,820 | B1 | 4/2019 | Kaminaga | |
| 10,381,434 | B1 | 8/2019 | Pachamuthu et al. | |
| 10,475,879 | B1 | 11/2019 | Pachamuthu et al. | |
| 10,672,780 | B1 | 6/2020 | Kawamura et al. | |
| 10,854,629 | B2 | 12/2020 | Ge et al. | |
| 10,937,801 | B2 | 3/2021 | Otsu et al. | |
| 10,957,706 | B2 | 3/2021 | Otsu et al. | |
| 10,971,514 | B2 | 4/2021 | Otsu et al. | |
| 11,749,600 | B2 * | 9/2023 | Tobioka ................. | H10B 41/27<br>257/314 |
| 11,991,881 | B2 * | 5/2024 | Tanaka ................... | H10B 41/35 |
| 2015/0236038 | A1 | 8/2015 | Pachamuthu et al. | |
| 2018/0061850 | A1 | 3/2018 | Mada et al. | |
| 2018/0108671 | A1 | 4/2018 | Yu et al. | |
| 2018/0130812 | A1 | 5/2018 | Hosoda et al. | |
| 2018/0261613 | A1 | 9/2018 | Ariyoshi | |
| 2018/0301374 | A1 | 10/2018 | Masamori et al. | |
| 2018/0342531 | A1 | 11/2018 | Susuki et al. | |
| 2020/0286916 | A1 | 9/2020 | Hojo et al. | |
| 2020/0403005 | A1 | 12/2020 | Sakurai et al. | |
| 2021/0159241 | A1 | 5/2021 | Li et al. | |
| 2021/0358936 | A1 | 11/2021 | Takuma et al. | |
| 2021/0358937 | A1 | 11/2021 | Yamaguchi et al. | |
| 2021/0358941 | A1 | 11/2021 | Kajiwara et al. | |
| 2021/0384206 | A1 | 12/2021 | Iwai et al. | |
| 2021/0384207 | A1 | 12/2021 | Iwai et al. | |
| 2022/0005818 | A1 | 1/2022 | Tanaka et al. | |
| 2022/0005824 | A1 | 1/2022 | Tanaka et al. | |

OTHER PUBLICATIONS

Endoh, T. et al., "Novel Ultra High Density Memory with a Stacked-Surrounding Gate Transistor (S-SGT) Structured Cell," IEDM Proc., (2001), 33-36.

U.S. Appl. No. 17/039,160, filed Sep. 30, 2020, SanDisk Technologies, LLC.

U.S. Appl. No. 17/146,866, filed Jan. 12, 2021, SanDisk Technologies, LLC.

U.S. Appl. No. 17/174,064, filed Feb. 11, 2021, SanDisk Technologies, LLC.

U.S. Appl. No. 17/174,094, filed Feb. 11, 2021, SanDisk Technologies, LLC.

U.S. Appl. No. 17/244,258, filed Apr. 29, 2021, SanDisk Technologies, LLC.

U.S. Appl. No. 17/244,311, filed Apr. 29, 2021, SanDisk Technologies, LLC.

U.S. Appl. No. 17/328,302, filed May 24, 2021, SanDisk Technologies, LLC.

U.S. Appl. No. 17/355,883, filed Jun. 23, 2021, SanDisk Technologies, LLC.

U.S. Appl. No. 17/462,446, filed Au. 31, 2021, SanDisk Technologies, LLC.

U.S. Appl. No. 17/510,833, filed Oct. 26, 2021, SanDisk Technologies, LLC.

* cited by examiner

100

300

200

49'
70(32)
42
32
32
42
32
42
32
10

49
70(32)
42
32
32
42
32
42
32
10

601
49'
11
10
50
56
54
52
70(32)
42
32

60L
62L
50
52
54
56
70(32)
42
32
11
10

46
46B
46A
86
86B
86A
20
46
46B
46A
44
32
t1
32
32
86
86B
86A
20
t2
65

THREE-DIMENSIONAL MEMORY DEVICE WITH CONTACT VIA STRUCTURES LOCATED OVER SUPPORT PILLAR STRUCTURES AND METHOD OF MAKING THEREOF

FIELD

The present disclosure relates generally to the field of semiconductor devices, and particularly to a three-dimensional memory device employing contact via structures overlying support pillar structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers containing stepped surfaces in a staircase region; memory openings vertically extending through the alternating stack; memory opening fill structures located in the memory openings, wherein each of the memory opening fill structures comprises a vertical semiconductor channel and a vertical stack of memory elements; a retro-stepped dielectric material portion overlying a portion of the alternating stack within the staircase region; a first contact via structure vertically extending through the retro-stepped dielectric material portion and contacting a first electrically conductive layer of the electrically conductive layers; and a first support pillar structure comprising a dielectric fill material located directly below the first contact via structure.

According to another aspect of the present disclosure, a method of forming a three-dimensional memory device is provided, which comprises: forming an alternating stack of insulating layers and sacrificial material layers over a substrate; forming support pillar structures through the alternating stack; forming stepped surfaces by patterning the alternating stack and the support pillar structures, wherein the stepped surfaces continuously extend from a bottommost layer of the alternating stack to a topmost layer of the alternating stack in a staircase region; forming a retro-stepped dielectric material portion over the stepped surfaces; forming memory openings through the alternating stack in a memory array region; forming memory opening fill structures in the memory openings, wherein each of the memory opening fill structures comprises a vertical semiconductor channel and a vertical stack of memory elements; forming electrically conductive layers by replacing at least the sacrificial material layers with at least one electrically conductive material; and forming contact via structures through the retro-stepped dielectric material portion in contact with the electrically conductive layers, wherein a first support pillar structure is located directly below a first contact via structure.

DETAILED DESCRIPTION

Figure 1:
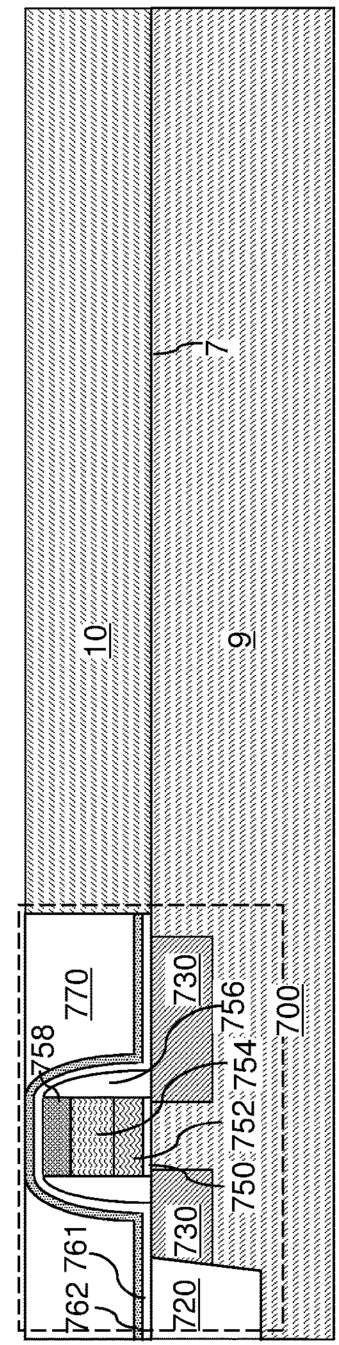
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to a three-dimensional memory device employing contact via structures overlying support pillar structures and methods of manufacturing the same, the various aspects of which are described below. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. In one embodiment, the major surface 7 can be a single crystalline semiconductor surface, such as a single crystalline silicon surface.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors.

A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a topmost surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
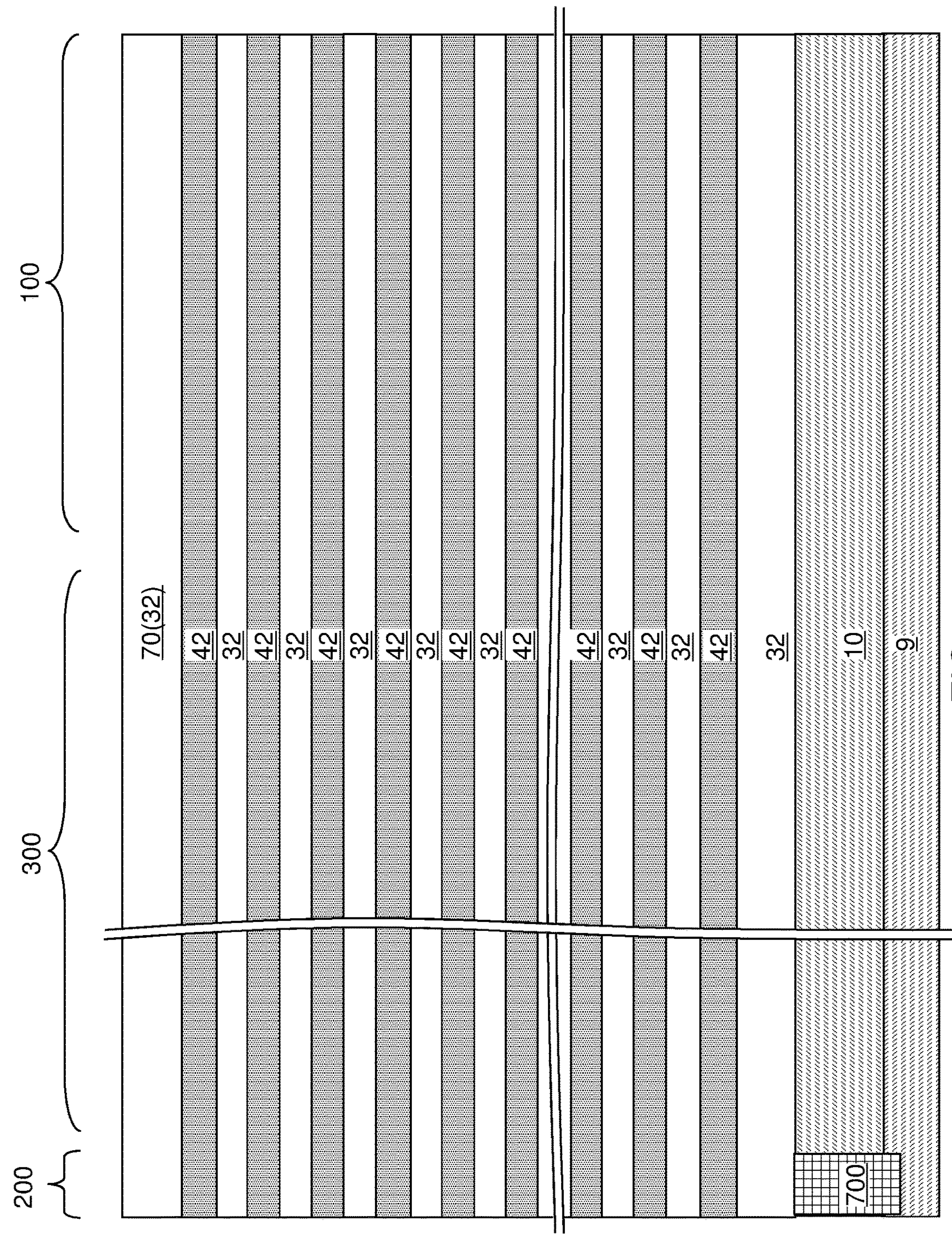
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer 42. In this case, the stack can include an alternating plurality of insulating layers 32 and sacrificial material layers 42, and constitutes an in-process alternating stack of insulating layers 32 and sacrificial material layers 42. As used herein, a "prototype" structure or an "in-process" structure refers to a transient structure that is subsequently modified in the shape or composition of at least one component therein.

Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride, and can consist essentially of silicon nitride.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. In this case, the insulating cap layer 70 may be a topmost insulating layer that is incorporated into the alternating stack (32, 42). The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3A:
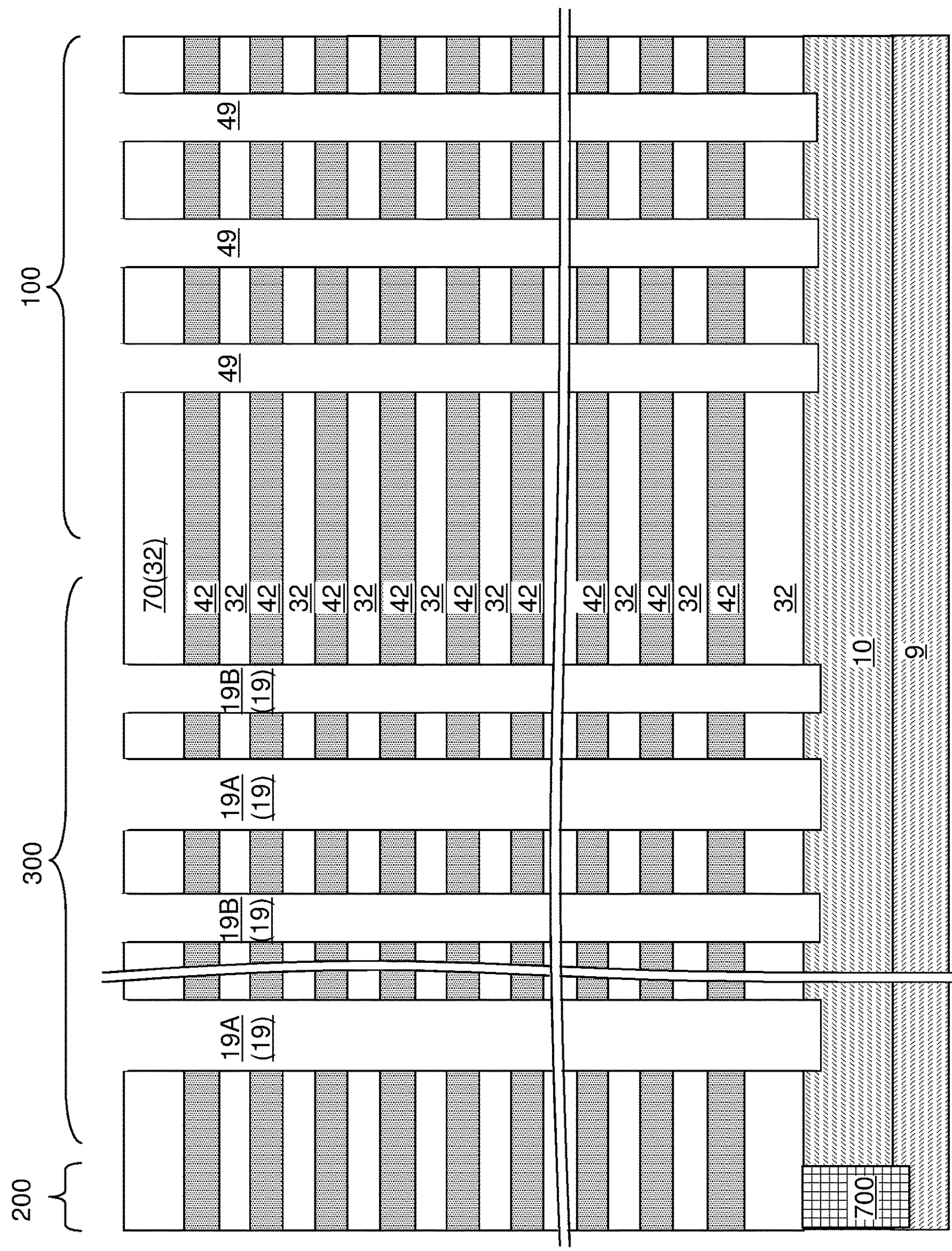
FIG. 3A is a schematic vertical cross-sectional view of the exemplary structure after formation of memory openings and support openings according to an embodiment of the present disclosure.
Figure 3B:
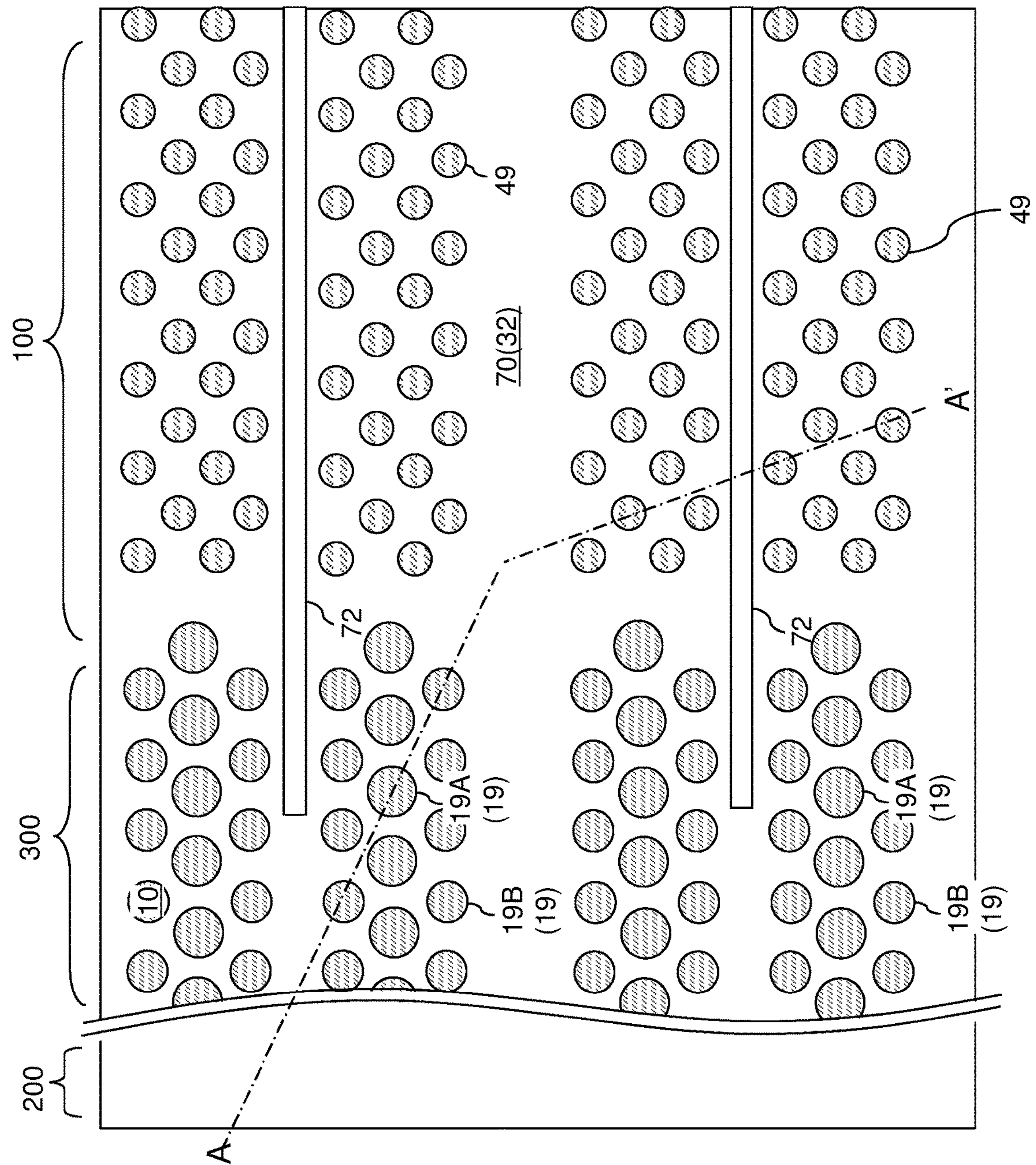
FIG. 3B is a top-down view of the exemplary structure of FIG. 3A. The vertical plane A-A' is the plane of the cross-section for FIG. 3A.

Referring to FIGS. 3A and 3B, a lithographic material stack (not shown) including at least a photoresist layer can be formed over the insulating cap layer 70, and can be lithographically patterned to form openings therein. In one embodiment, the openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to an opening in which a memory film and semiconductor channel are subsequently formed. As used herein, a "support opening" refers to an opening in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 and the support openings 19 extend through the entirety of the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered.

The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer (e.g., silicon wafer) 9.

According to an aspect of the present disclosure, the support openings 19 may comprise first support openings 19A that are formed in areas in which layer-contact via structures are to be subsequently formed and second support openings 19B that are formed outside areas in which the layer-contact via structures are to be subsequently formed. The layer-contact via structures contact a respective one of electrically conductive layers, which will be formed by replacement of the sacrificial material layers with electrically conductive material portions at a later processing step prior to formation of the layer-contact via structures. According to an aspect of the present disclosure, the second support openings 19B may be formed around the first support openings 19A such that the second support openings 19B are interlaced with the first support openings 19A. In one embodiment, the area of each first memory opening 19A may be greater than the area of each second support opening 19B. In one embodiment in which the memory openings 19 are cylindrical, the diameter of each first memory opening 19A may be greater than the diameter of each second support opening 19B.

Figure 4:
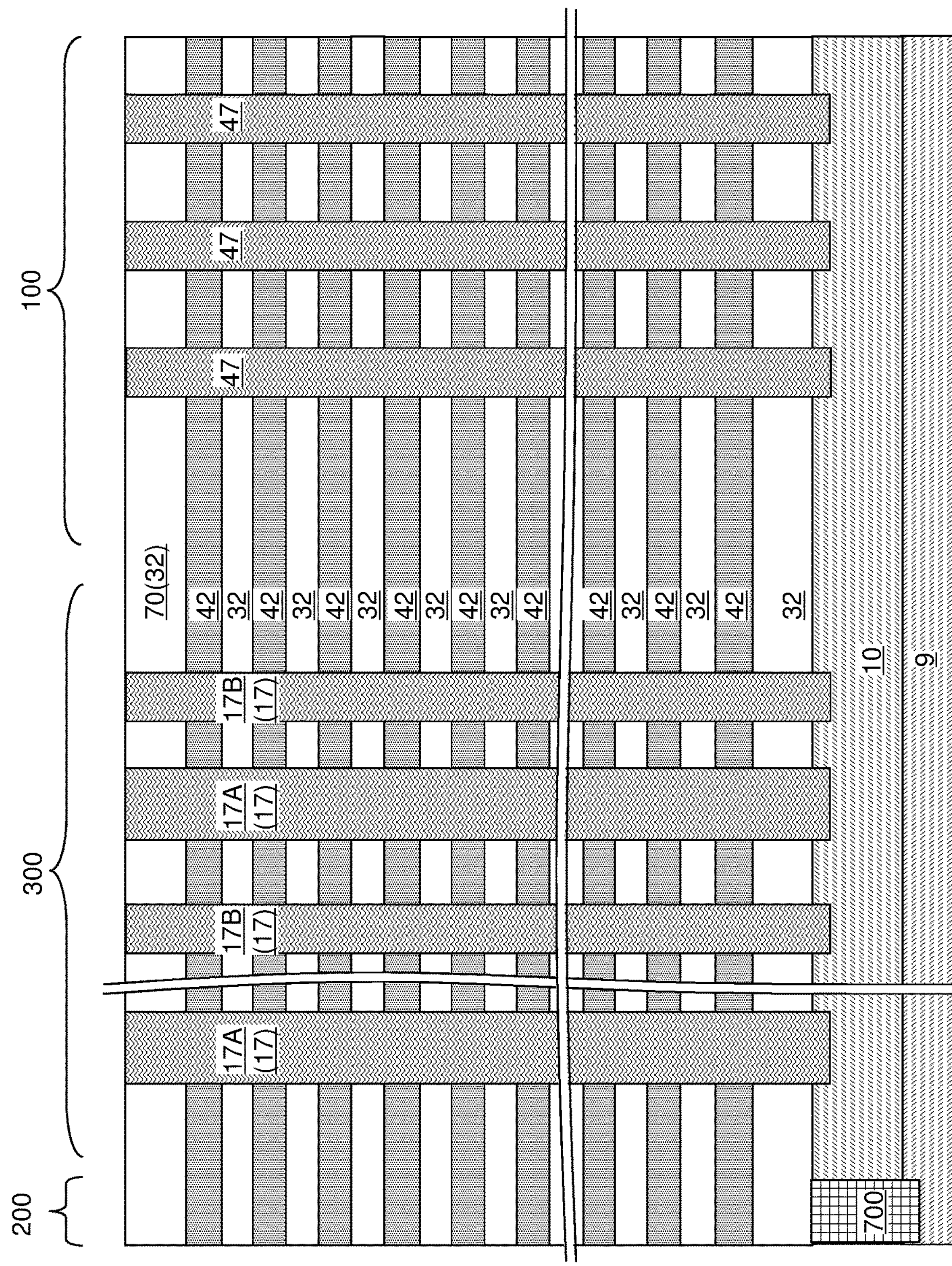
FIG. 4 is a vertical cross-sectional view of the exemplary structure after formation of sacrificial memory opening fill structures and sacrificial support opening fill structures according to an embodiment of the present disclosure.

Referring to FIG. 4, a sacrificial fill material can be deposited in the memory openings 49 and the support openings 19. The sacrificial fill material comprises a material that can be removed selective to materials of the insulating layers 32 and the sacrificial material layers 42 and the semiconductor material layer 10. For example, the sacrificial fill material may comprise amorphous silicon, a silicon-germanium alloy, organosilicate glass, amorphous carbon, a carbon-based material, or a polymer material. Optionally, a thin etch stop liner (not shown) such as a silicon oxide liner, a silicon nitride liner, or a dielectric metal oxide liner may be formed on sidewalls and bottom surfaces of the memory openings 19 and the support openings 19 so that the sacrificial fill material may be subsequently removed while minimizing collateral etching of the materials of the insulating layers 32 and the sacrificial material layers 42. Excess portions of the sacrificial fill material can be removed from above the horizontal plane including the top surface of the insulating cap layer 70 by a planarization process. The planarization process may employ a chemical mechanical polishing (CMP) process and/or a recess etch process. Each remaining portion of the sacrificial fill material that fills the memory openings 49 constitutes a sacrificial memory opening fill structure 47. Each remaining portion of the sacrificial fill material that fills the support openings 19 constitutes a sacrificial support opening fill structure 17. The sacrificial support opening fill structures 17 comprise first sacrificial support opening fill structures 17A that fill the first support openings 19A and second sacrificial support opening fill structures 17B that fill the second support openings 19B.

Figure 5:
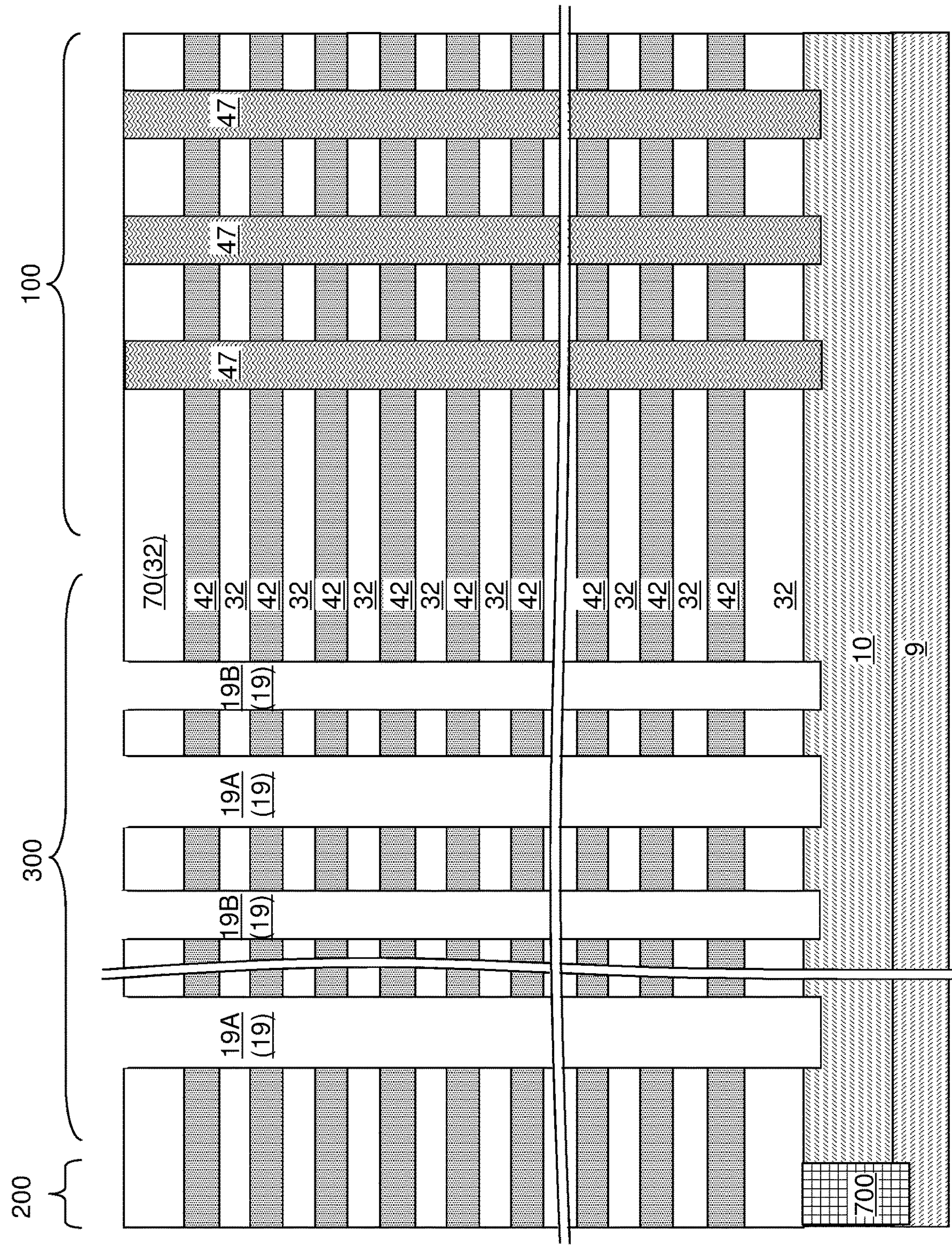
FIG. 5 is a vertical cross-sectional view of the exemplary structure after removal of the sacrificial support opening fill structures according to an embodiment of the present disclosure.

Referring to FIG. 5, a photoresist layer (not shown) can be applied over the insulating cap layer 70, and can be lithographically patterned to a cover the memory array region 100 without covering the contact region 300. A selective etch process can be performed to remove the sacrificial fill material of the sacrificial support opening fill structures 17. The selective etch process and removes the sacrificial fill material of the sacrificial support opening fill structures 17 selective to materials of the insulating layers 32, the sacrificial material layers 42, and the semiconductor material layer 10. If employed, thin etch stop liners located at peripheral portions of the support openings 19 may function as etch stop structures during the selective etch process. The thin etch stop liners may be subsequently removed, for example, by performing an isotropic etch process such as a wet etch process. In an illustrative example, if the sacrificial support opening fill structures 17 comprise amorphous silicon, then a wet etch process employing hot trimethyl-2 hydroxyethyl ammonium hydroxide ("hot TMY") or tetramethyl ammonium hydroxide (TMAH) may be performed to remove the sacrificial support opening fill structures 17. The photoresist layer can be subsequently removed, for example, by ashing. Voids are formed in volumes of the support openings 19, which comprise the first support openings 19A and the second support openings 19B.

In an alternative embodiment, the memory openings 49 and the support openings 19 may be formed in separate photolithography and etching steps. In this alternative embodiment, the memory openings 49 are formed first by photolithography (e.g., by forming and patterning a first photoresist layer) and etching without forming the support openings 19. The first photoresist layer is then removed. The memory openings 49 are then filled with the sacrificial memory opening fill structures 47. After forming the sacrificial memory opening fill structures 47, a second photoresist layer is formed and patterned to leave openings in the contact region 300. The support openings 19 are then formed by etching using the second photoresist layer as a mask. The second photoresist layer is then removed.

Figure 6:
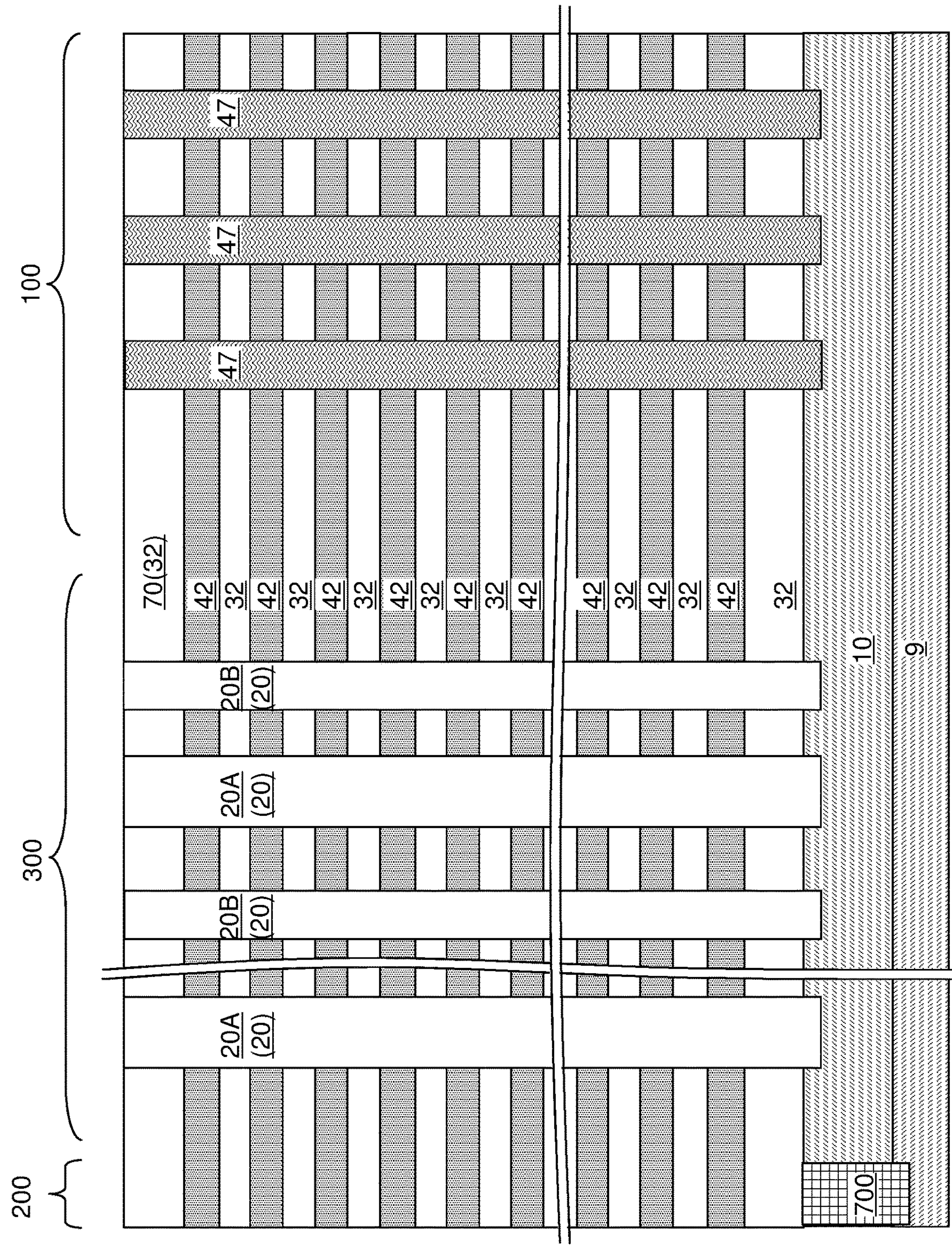
FIG. 6 is a vertical cross-sectional view of the exemplary structure after formation of support pillar structures according to an embodiment of the present disclosure.

Referring to FIG. 6, a dielectric fill material, such as a silicon oxide, is deposited in the support openings 19 by a conformal deposition process, such as a low pressure chemical vapor deposition process. Excess portions of the dielectric fill material can be removed from above the horizontal plane including the top surface of the insulating cap layer 70 by a planarization process. The planarization process may employ a chemical mechanical polishing process and/or a recess etch process. Each remaining portion of the dielectric fill material that fills the support openings 19 constitutes a support pillar structure 20. The support pillar structures 20 comprise first support pillar structures 20A that fill the first support openings 19A and second support pillar structures 20B that fill the second support openings 19B. Each support pillar structure 20 may comprise a straight sidewall that vertically extends from the semiconductor material layer 10, through each layer within the alternating stack (32, 420, and to a top surface of the insulating cap layer 70. If the support pillar structures 20 are cylindrical, then the first support pillar structures 20A may have a larger diameter than the second support pillar structures 20B.

Figure 7:
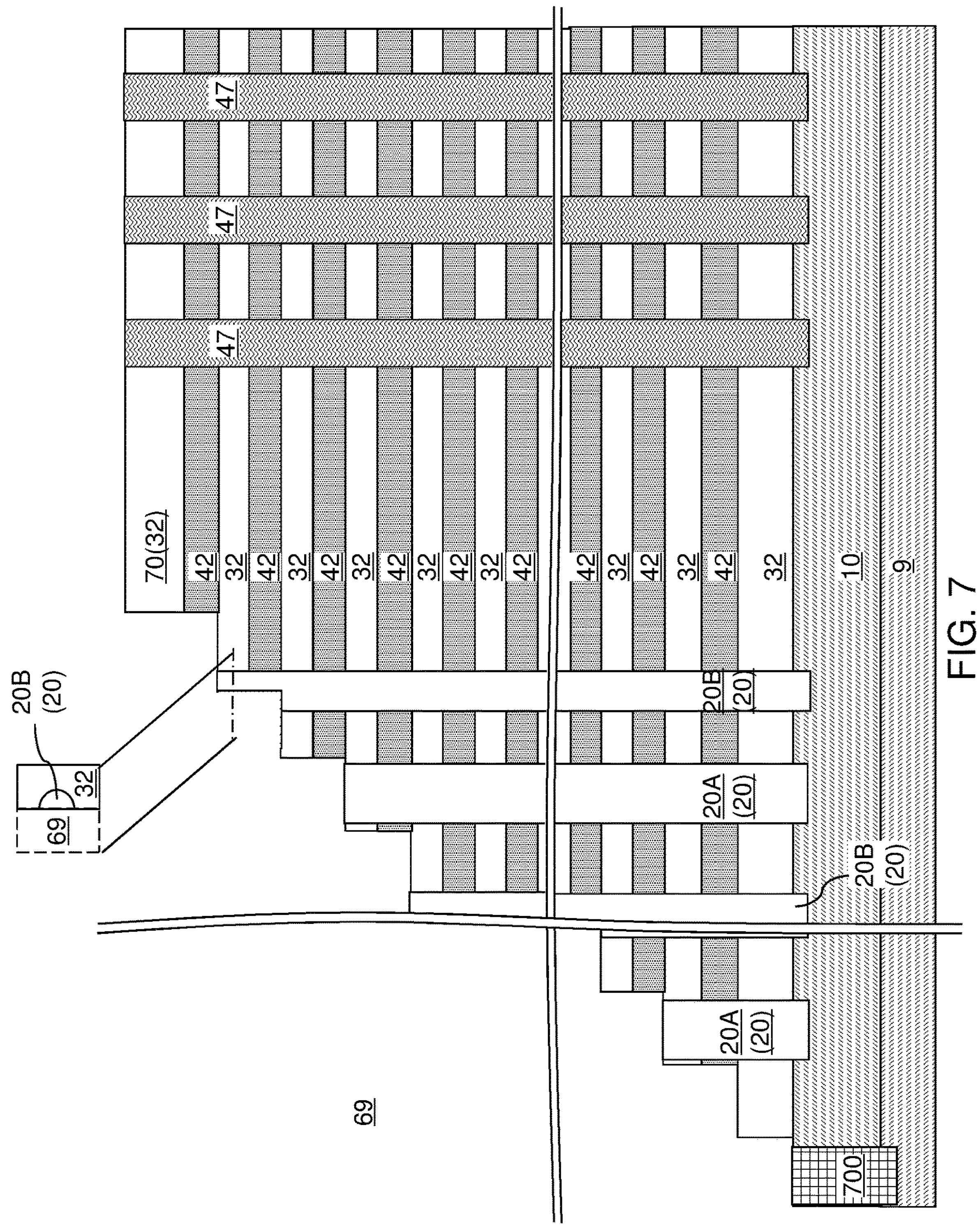
FIG. 7 is a vertical cross-sectional view of the exemplary structure after formation of the stepped surfaces according to an embodiment of the present disclosure.

Referring to FIG. 7, stepped surfaces are formed at a peripheral region of the alternating stack (32, 42) within the contact region 300. The region in which the stepped surfaces are formed is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity 69 is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42). The support pillar structures 20 are patterned concurrently with formation of the stepped surfaces. In one embodiment, etch processes employed to pattern the alternating stack (32, 42) can employ the etch chemistries selective to provide about the same etch a rates for the material of the support pillar structures 20.

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In one embodiment, vertical surfaces within the stepped surfaces may be perpendicular to a boundary between the memory array region 100 and the contact region 300. The horizontal direction that is perpendicular to the boundary between the memory array region 100 and the contact region 300 is herein referred to as a first horizontal direction. The horizontal direction that is perpendicular to the first horizontal direction is herein referred to as a second horizontal direction.

In one embodiment, a patterned trimmable mask layer can be formed over the insulating cap layer 70, a set of processing steps can be iteratively performed multiple times to provide the stepped surfaces. In this case, the patterned trimmable mask layer as initially formed (i.e., before performing the first iteration of the set of processing steps) covers the memory array region 100 and a predominant portion of the contact region 300 except a distal edge region of the contact region 300 (which is distal from the memory array region 100). Each set of processing steps may comprise an anisotropic etch process that vertically recesses unmasked portions of alternating stack and the support pillar structures employing the patterned trimmable mask layer as an etch mask, and a trimming process that trims the patterned trimmable mask layer by the width of a next step to be subsequently formed. Thus, a combination of an anisotropic etch process and a mask trimming process may be repeatedly performed to vertically recess unmasked portions of the alternating stack (32, 42) and the support pillar structures 20 during each anisotropic etch process. The chemistry of the anisotropic etch process can be selected such that the recess etch rate for unmasked portions of the support pillar structure 20 is about the same as the recess etch rate for the materials of the alternating stack (32, 42).

Top horizontal surfaces of the support pillar structures 20 are vertically recessed by different recess distances during formation of the stepped surfaces, and may be coplanar with an exposed top horizontal surface of a respective insulating layer 32 exposed at the top of each horizontal step in the staircase region. The top horizontal surfaces of the sacrificial material layers 42 are covered by the overlying insulating layer 32 in each horizontal step. Generally, the alternating stack (32, 42) and the support pillar structures 20 can be patterned such that the stepped surfaces continuously extend from a bottommost layer of the alternating stack (32, 42) to a topmost layer of the alternating stack in a staircase region.

In one embodiment, locations of the vertical steps in the staircase region may be selected such that the vertical steps do not overlap with the areas of the first support pillar structures 20A in a plan view, i.e., a view along the vertical direction such as the top-down view. Optionally, the vertical steps in the staircase region may overlap with the areas of the second support pillar structures in the plan view 20B. In this case, the entirety of the top surface of each first support pillar structure 20A may be planar (e.g., co-planar with a top horizontal surface of a respective insulating layer 32 exposed in the respective horizontal step), and at least a subset of the second support pillar structures 20B may have a respective stepped top surface. Specifically, as shown in the horizontal cross-sectional view inset in FIG. 7, at least a subset of the second support pillar structures 20B may have a top surface that includes a first top surface segment located within a respective first horizontal plane, a vertical surface segment that is adjoined to a straight edge of the first top surface segment, and a second top surface segment located within a respective second horizontal plane that is vertically offset from the first horizontal plane and adjoined to a straight bottom edge of the vertical surface segment. The first horizontal plane includes a horizontal top surface of a first insulating layer 32 exposed in a first horizontal step, and the second horizontal plane includes a horizontal top surface of a second insulating layer 32 exposed in a second horizontal step underlying the first horizontal step.

Figure 8:
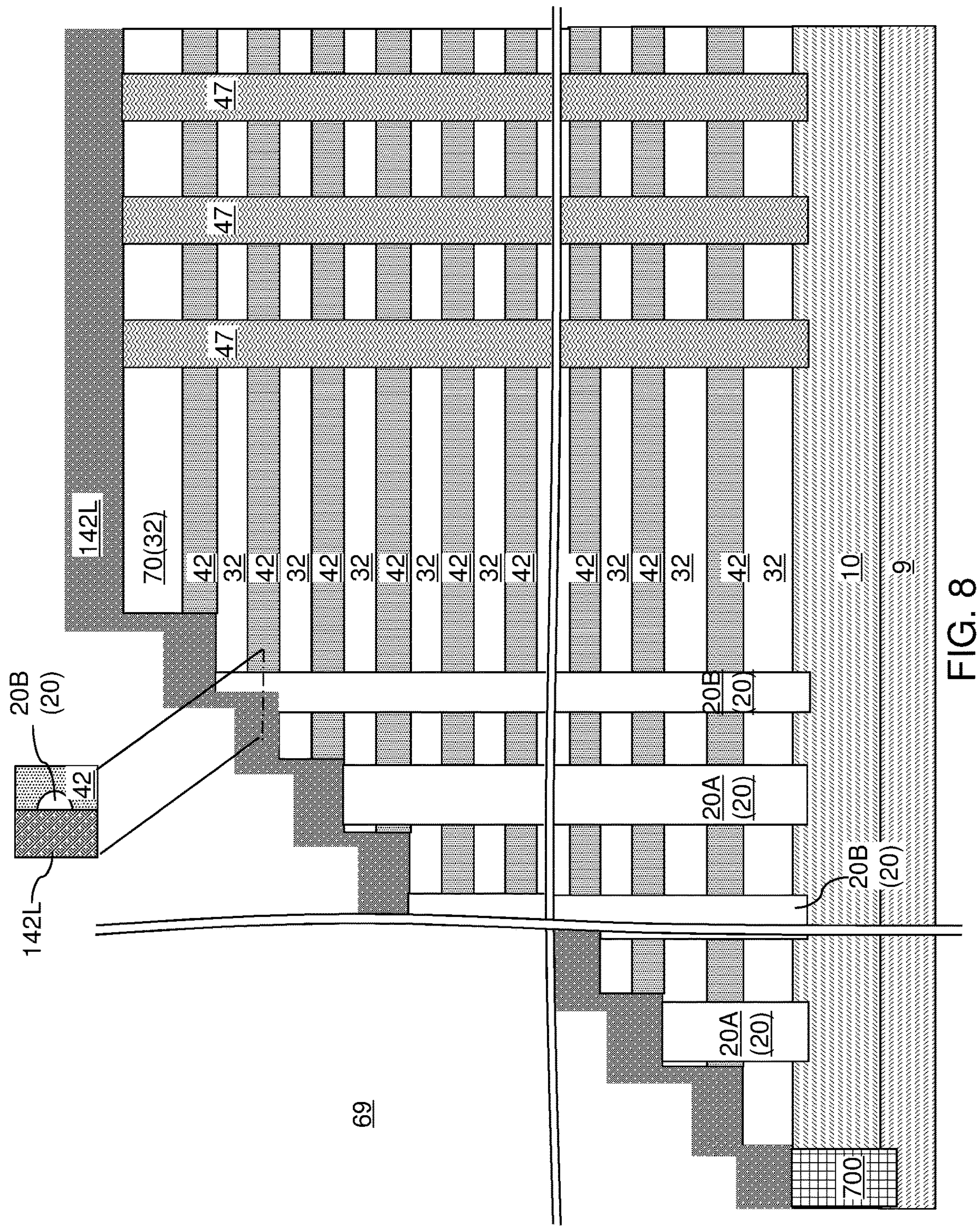
FIG. 8 is a vertical cross-sectional view of the exemplary structure after an anisotropic deposition of a sacrificial pad material layer according to an embodiment of the present disclosure.

Referring to FIG. 8, a sacrificial pad material layer 142L can be deposited by an anisotropic deposition process. The anisotropic deposition process deposits a thicker sacrificial pad material on physically exposed horizontal surfaces than on physically exposed vertical surfaces. The anisotropic deposition process may comprise a physical vapor deposition process (e.g., sputtering) or a plasma-enhanced chemical vapor deposition process. The ratio of the thickness of the sacrificial pad material layer 142 over horizontal surfaces to the thickness of the sacrificial pad material layer 142 over vertical surfaces may be, for example, in a range from 1.1 to 3.0, such as from 1.2 to 2.4 and/or from 1.3 to 2.0.

The sacrificial pad material may be the same as, or may be different from, the material of the sacrificial material layers 42. Generally, the sacrificial pad material comprises a material that can be subsequently removed selective to the materials of the insulating layers 32 and the semiconductor material layers 10. In one embodiment, the material of the sacrificial material layers 42 and the material of the sacrificial pad material layer 142L may comprise, and/or may consist essentially of, silicon nitride. The difference between the thickness of horizontally-extending portions of the sacrificial pad material layer 142L and the thickness of vertically-extending portions of the sacrificial pad material layer 142L may be in a range from 100% to 200%, such as from 110% to 150%, of the thickness of each of the sacrificial material layers 42.

Figure 9:
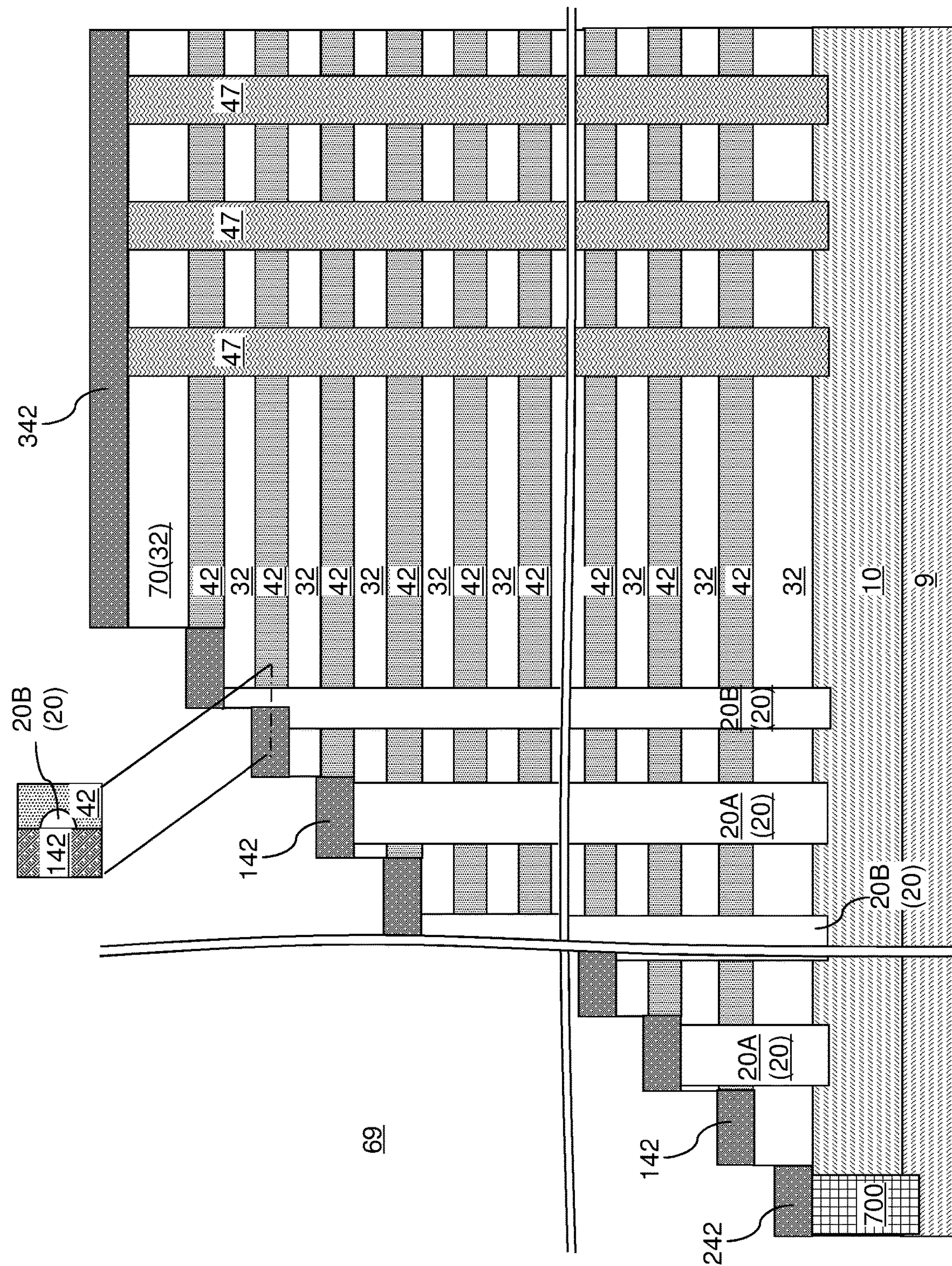
FIG. 9 is a vertical cross-sectional view of the exemplary structure after patterning the sacrificial pad material layer into sacrificial pad structures according to an embodiment of the present disclosure.

Referring to FIG. 9, an isotropic etch process can be performed to isotropically recess the sacrificial pad material layer 142L selective to the material of the insulating layers 32. For example, if the sacrificial pad material layer 142L comprises silicon nitride, a wet etch process employing hot phosphoric acid can be performed to isotropically recess the material of the sacrificial pad material layer 142L. The duration of the isotropic etch process can be selected such that the total recess distance of the sacrificial pad material is greater than the thickness of the vertically-extending portions of the sacrificial pad material layer 142L, and is less than the thickness of the horizontally-extending portions of the sacrificial pad material layer 142L. Thus, the vertically-extending portions of the sacrificial pad material layer 142L are removed, and sidewalls of the insulating layers 32 can be physically exposed in the staircase region. The sacrificial pad material layer 142L is divided into a plurality of horizontally-extending strips that are vertically spaced apart from each other.

The plurality of horizontally-extending strips derived from the sacrificial pad material layer 142L comprise sacrificial pad structures 142 that are formed directly on a sidewall of a respective one of the sacrificial material layers 42 and overlying and contacting a top surface of a respective one of the insulating layers 32, an optional dielectric pad material layer 242 that is formed over the at least one semiconductor device 700 (if present), and a sacrificial cap layer 342 that is formed over the insulating cap layer 70. The thickness of the remaining horizontally-extending portions of the sacrificial pad material layer 142L after the isotropic etch process (i.e., the thickness of the sacrificial pad structures 142, the dielectric pad material layer 242, and the sacrificial cap layer 342) may be in a range from 20% to 200%, such as from 40% to 150% and/or from 60% to 120%, of the thickness of each of the sacrificial material layers 42 and/or the average thickness of the sacrificial material layers 42. If the thickness of the sacrificial pad structures 142 is not sufficient, then the steps of FIGS. 8 and 9 may be repeated one or more times to increase the thickness of the sacrificial pad structures 142.

The top surface of each of the first support pillar structures 20A may be entirety covered by a respective one of the sacrificial pad structures 142. In one embodiment shown in the inset in FIG. 9, at least a subset of the second support pillar structures 20B may have a top surface that contacts a respective first sacrificial pad structure 142, a vertical surface segment that is adjoined to a straight edge of the first top surface segment and comprising an upper region that is physically exposed to the stepped cavity 69 and a lower region that contacts a sidewall of a respective second sacrificial pad structure 142, and a second top surface segment that is adjoined to a straight bottom edge of the vertical surface segment and contacting a bottom surface of the respective second sacrificial pad structure 142. The second sacrificial pad structure 142 is located below the first sacrificial pad structure 142. Generally, the sacrificial pad structures 142 can be formed by anisotropically depositing a sacrificial pad material over the stepped surfaces and by isotropically etching the sacrificial pad material. In one embodiment, the sacrificial pad structures 142 may be formed directly on the support pillar structures 20 after formation of the stepped surfaces.

Figure 10A:
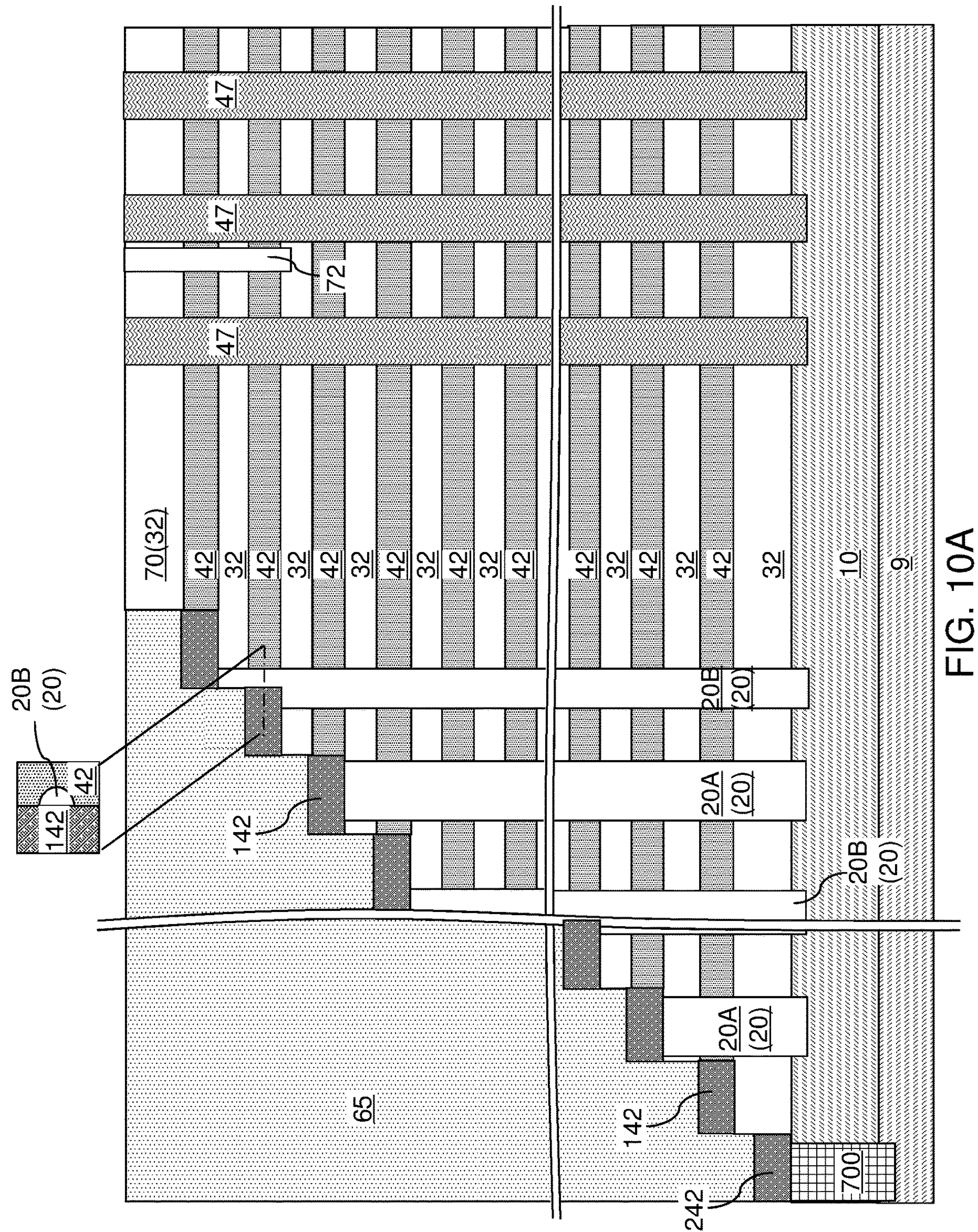
FIG. 10A is a vertical cross-sectional view of the exemplary structure after formation of a retro-stepped dielectric material portion according to an embodiment of the present disclosure.
Figure 10B:
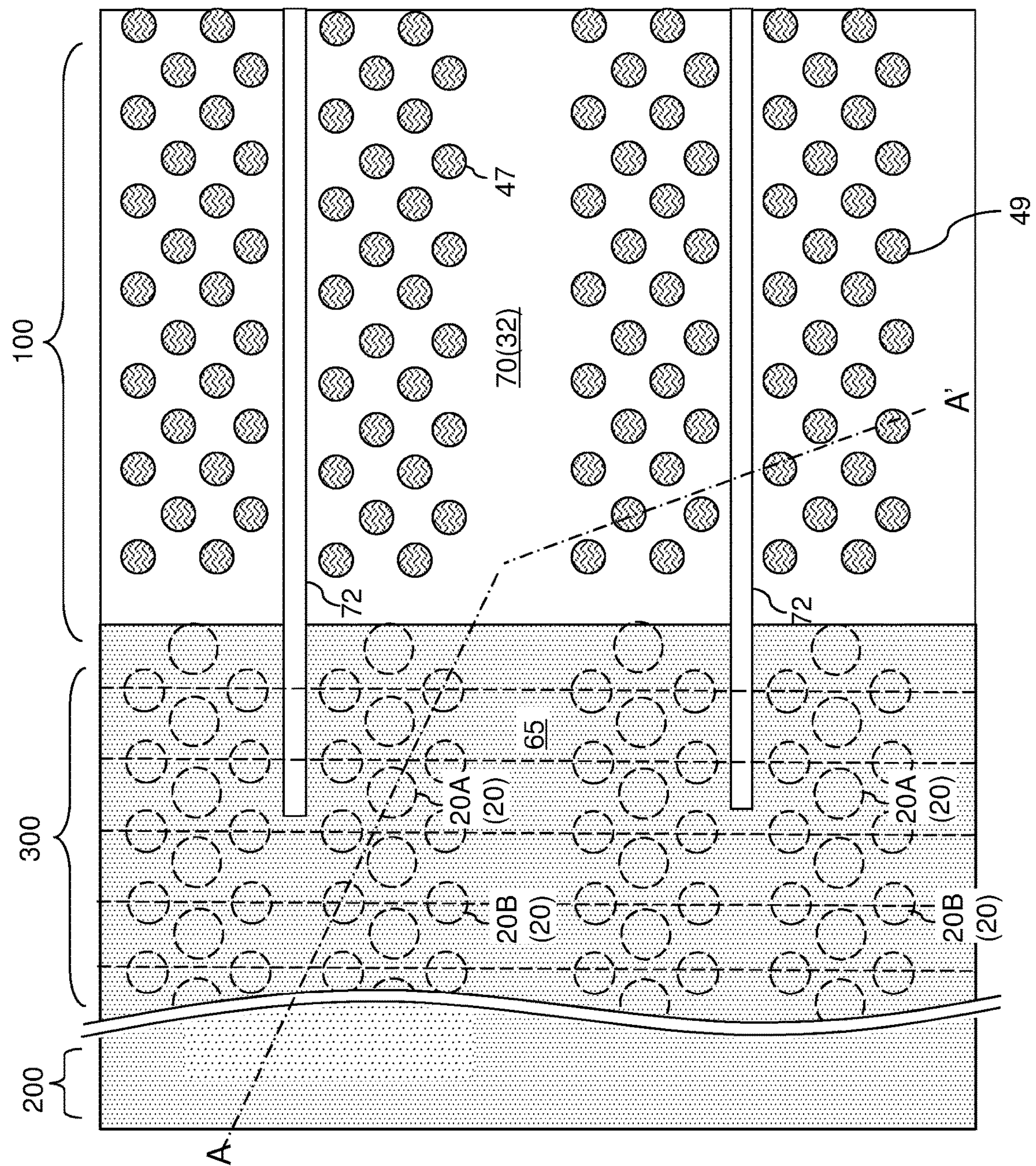
FIG. 10B is a top-down view of the exemplary structure of FIG. 10A. The vertical plane A-A' is the plane of the cross-section for FIG. 10A.

Referring to FIGS. 10A and 10B, a retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material and the sacrificial cap layer 342 can be removed from above the top surface of the insulating cap layer 70, for example, by chemical mechanical planarization (CMP). The remaining portion of the deposited dielectric material filling the stepped cavity 69 constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Generally, the retro-stepped dielectric material portion 65 can be formed over the stepped surfaces. The retro-stepped dielectric material portion 65 can be formed over the support pillar structures 20 after the top surfaces of the support pillar structures 20 are vertically recessed. The retro-stepped dielectric material portion 65 can be formed directly on the sacrificial pad structures 142.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 11:
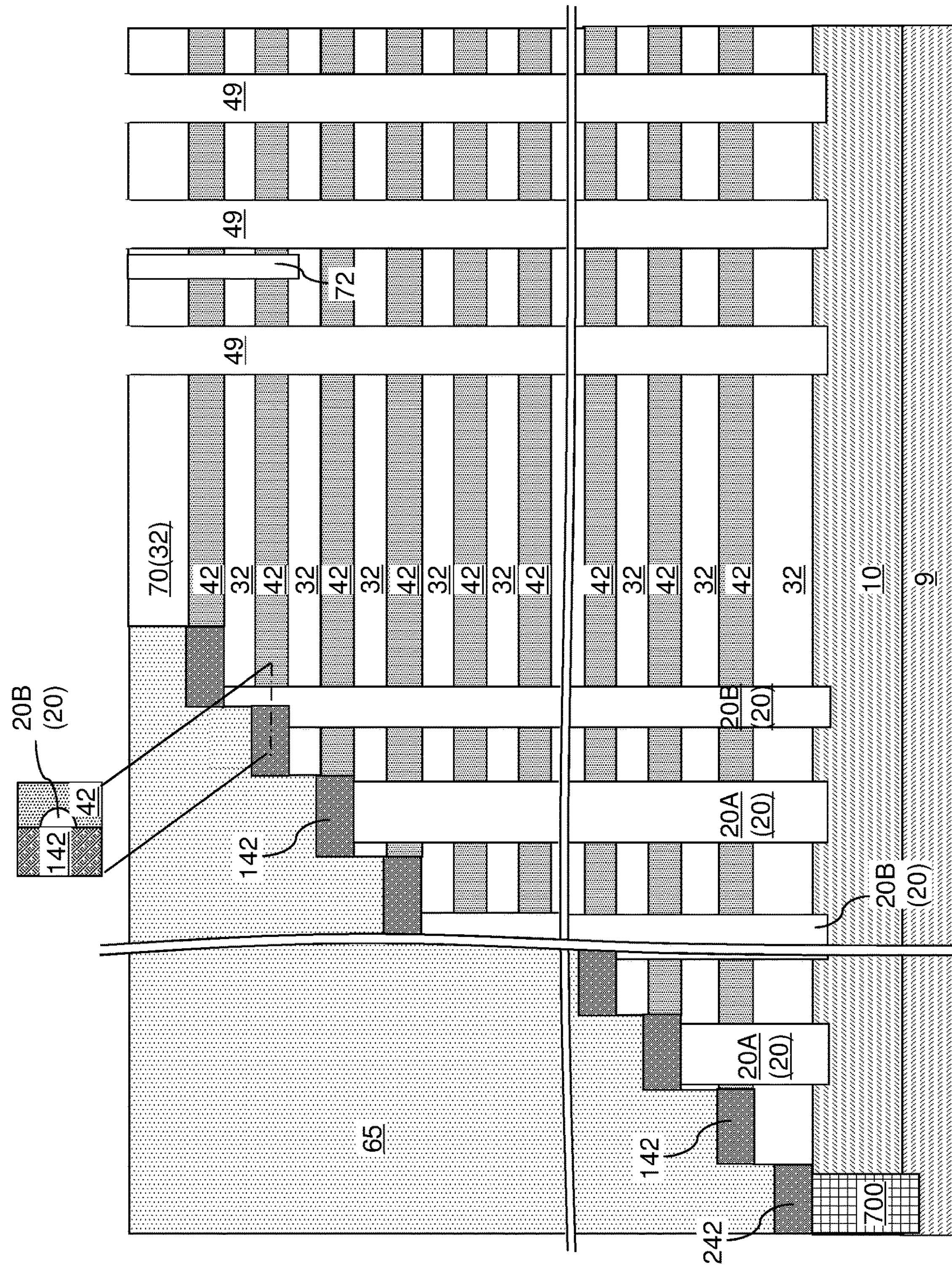
FIG. 11 is a vertical cross-sectional view of the exemplary structure after removal of the sacrificial memory opening fill structures according to an embodiment of the present disclosure.

Referring to FIG. 11, a selective etch process can be performed to remove the sacrificial fill material of the sacrificial memory opening fill structures 47. The selective etch process and removes the sacrificial fill material of the sacrificial memory opening fill structures 47 selective to materials of the insulating layers 32, the sacrificial material layers 42, and the semiconductor material layer 10. If employed, thin etch stop liners located at peripheral portions of the memory openings 49 may function as etch stop structures during the selective etch process. The thin etch stop liners may be subsequently removed, for example, by performing an isotropic etch process such as a wet etch process. In an illustrative example, if the sacrificial memory opening fill structures 47 comprise amorphous silicon or a silicon-germanium alloy, a wet etch process employing hot trimethyl-2 hydroxyethyl ammonium hydroxide ("hot TMY") or tetramethyl ammonium hydroxide (TMAH) may be performed to remove the sacrificial memory opening fill structures 47. Voids are formed in volumes of the memory openings 49.

FIGS. 12A-12H are sequential schematic vertical cross-sectional views of a memory opening within the exemplary structure during formation of a memory stack structure 55, an optional dielectric core 62, and a drain region 63 therein according to an embodiment of the present disclosure.

Figures 12A, 12B:
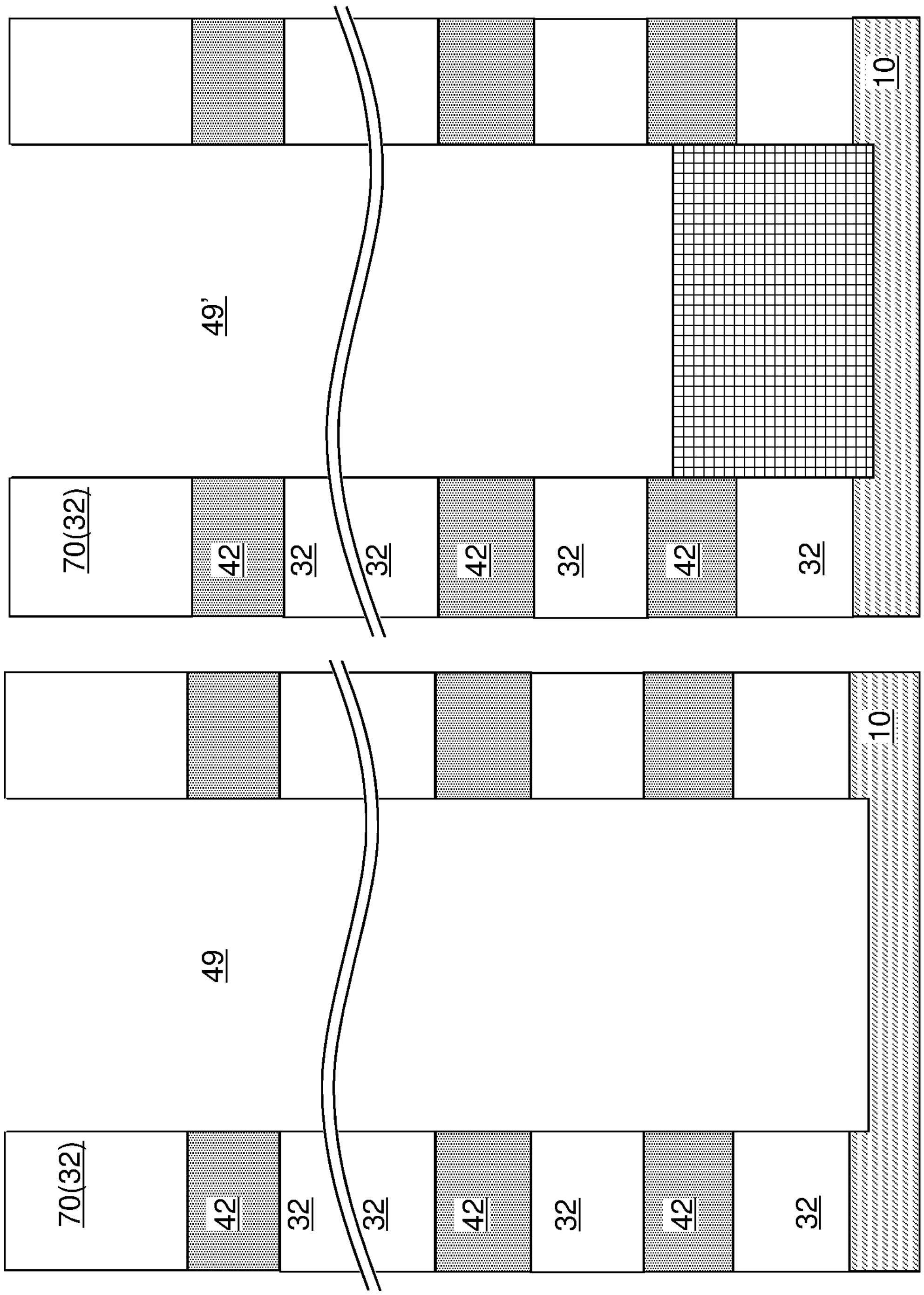
FIGS. 12A-12H are sequential schematic vertical cross-sectional views of a memory opening within the exemplary structure during formation of a memory stack structure, an optional dielectric core, and a drain region therein according to an embodiment of the present disclosure.

Referring to FIG. 12A, a memory opening 49 in the exemplary device structure of FIG. 11 is illustrated. The memory opening 49 extends through the insulating cap layer 70, the alternating stack (32, 42), and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 12B, an optional pedestal channel portion (e.g., an epitaxial pedestal) 11 can be formed at the bottom portion of each memory opening 49, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Figures 12C, 12D:
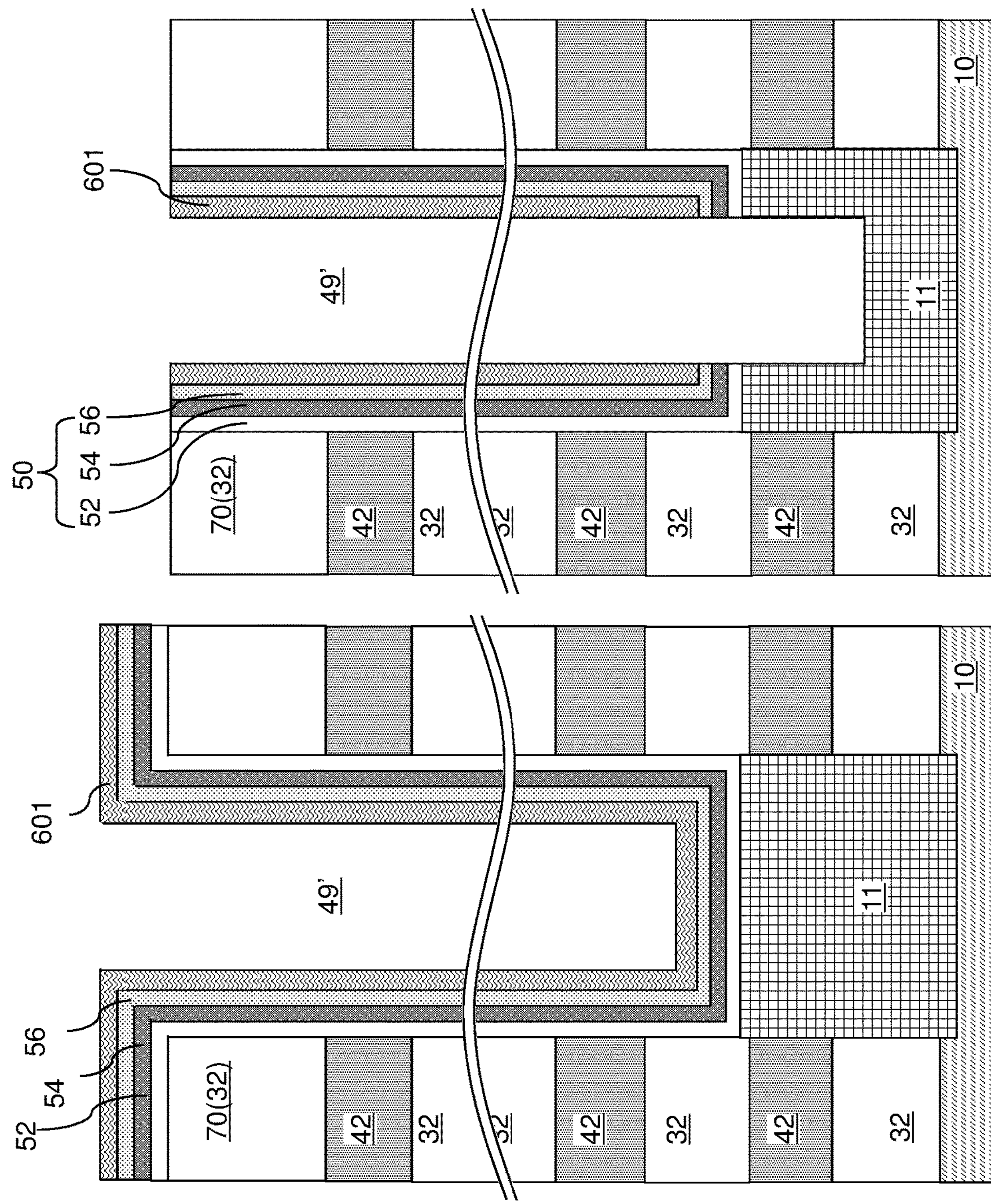

Referring to FIG. 12C, a stack of layers including an optional blocking dielectric layer 52, a memory material layer 54, a memory isolation layer 56, and an optional sacrificial cover material layer 601 can be sequentially deposited in the memory openings 49 by a respective conformal deposition process.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. In one embodiment, the blocking dielectric layer 52 includes aluminum oxide. In one embodiment, the blocking dielectric layer 52 can include multiple dielectric metal oxide layers having different material compositions. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. The thickness of the blocking dielectric layer 52 can be in a range from 3 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be formed. The memory material layer 54 may comprise any memory material that can store information therein. For example, the memory material layer 54 may comprise a charge storage layer that can store electrical charges therein, a ferroelectric material layer that can store information in the form of a ferroelectric polarization direction, or a resistive material layer having multiple resistive states that can be modulated by thermal cycling. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer. The thickness of the memory material layer 54 can be in a range from 2 nm to 20 nm, although lesser and greater thicknesses can also be employed.

The memory isolation layer 56 includes a dielectric material that can provide electrical isolation to the memory material layer 54. In case the memory material layer 54 comprises a charge storage layer, the memory isolation layer 56 may comprise a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the three-dimensional NAND string memory device to be formed. The memory isolation layer 56 can include silicon oxide, silicon nitride, silicon oxynitride, dielectric metal oxide (such as aluminum oxide or hafnium oxide), and/or combinations thereof. In one embodiment, the memory isolation layer 56 can include a stack of a first silicon oxide layer, a silicon oxynitride layer, and a second silicon oxide layer, which is commonly known as an ONO stack. The thickness of the memory isolation layer 56 can be in a range from 2 nm to 20 nm, although lesser and greater thicknesses can also be employed.

The optional sacrificial cover material layer 601 includes a sacrificial material that can be subsequently removed selective to the material of the memory isolation layer 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 12D, the optional sacrificial cover material layer 601, the memory isolation layer 56, the memory material layer 54, and the blocking dielectric layer 52 overlying the insulating cap layer 70 are sequentially anisotropically etched employing at least one anisotropic etch process. The portions of the sacrificial cover material layer 601, the memory isolation layer 56, the memory material layer 54, and the blocking dielectric layer 52 located above the top surface of the insulating cap layer 70 can be removed by the at least one anisotropic etch process. Further, the horizontal portions of the sacrificial cover material layer 601, the memory isolation layer 56, the memory material layer 54, and the blocking dielectric layer 52 at a bottom of each memory cavity 49' can be removed to form openings in remaining portions thereof. Each of the sacrificial cover material layer 601, the memory isolation layer 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material, a ferroelectric material, or a resistive memory material that can provide at least two different levels of resistivity (such as a phase change material), or any other memory material that can store information by a change in state. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the memory isolation layer 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A memory isolation layer 56 is located over the memory material layer 54. A set of a blocking dielectric layer 52, a memory material layer 54, and a memory isolation layer 56 in a memory opening 49 constitutes a memory film 50, which includes a plurality of charge storage regions (comprising portions of the memory material layer 54) that are insulated from surrounding materials by the blocking dielectric layer 52 and the memory isolation layer 56. In one embodiment, the sacrificial cover material layer 601, the memory isolation layer 56, the memory material layer 54, and the blocking dielectric layer 52 can have vertically coincident sidewalls. The sacrificial cover material layer 601 can be subsequently removed selective to the material of the memory isolation layer 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Figures 12E, 12F:
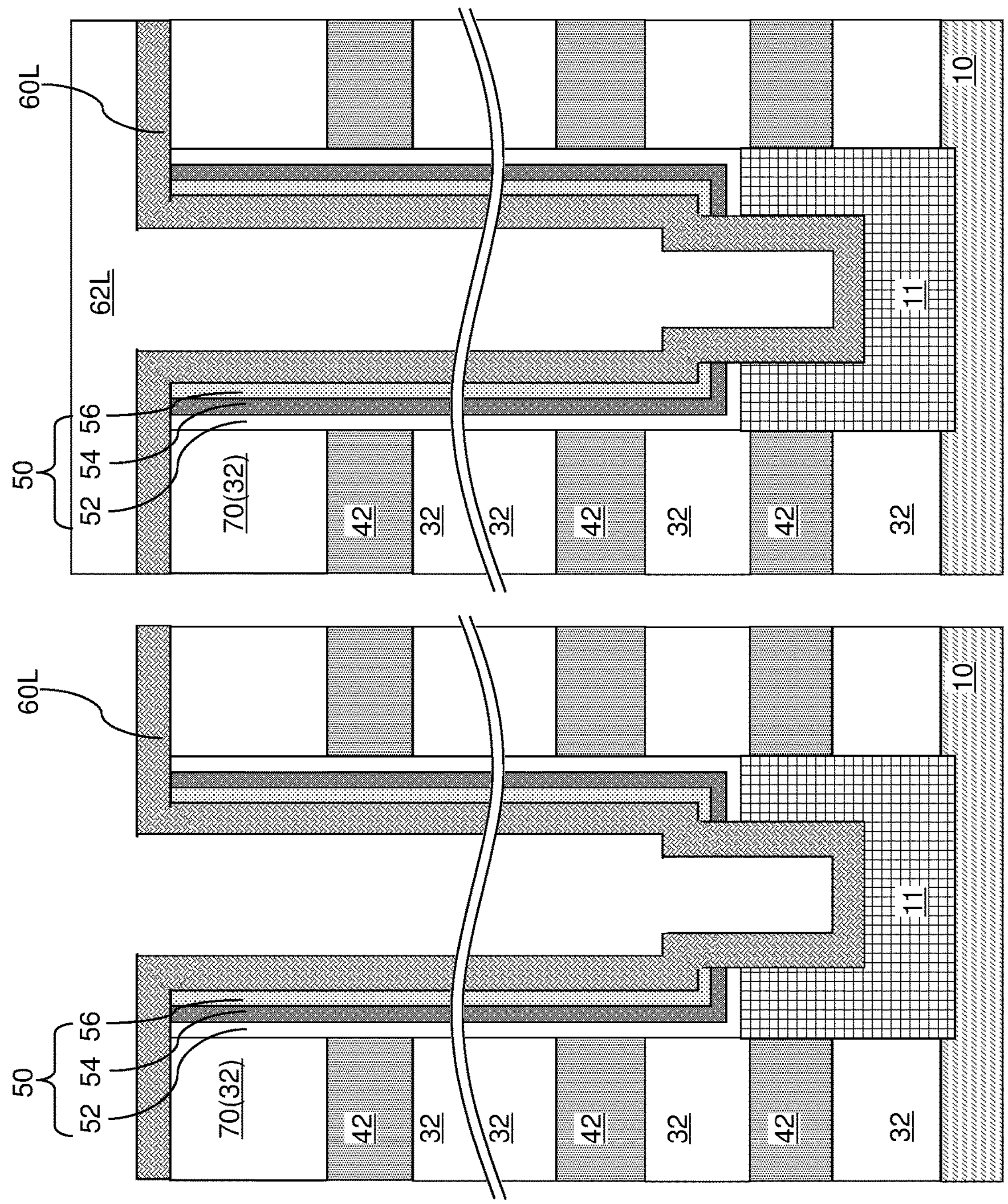

Referring to FIG. 12E, a semiconductor channel layer 60L can be deposited directly on the semiconductor surface of the pedestal channel portion 11 or the semiconductor material layer 10 if the pedestal channel portion 11 is omitted, and directly on the memory isolation layer 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 12F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 12H:
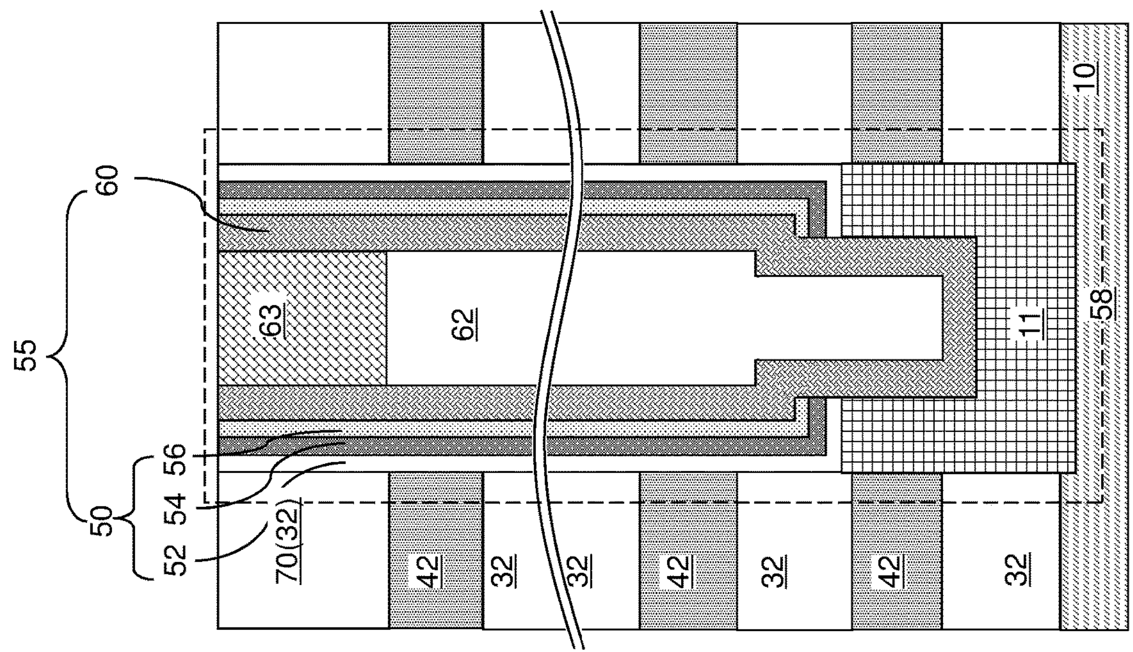
Figure 12G:
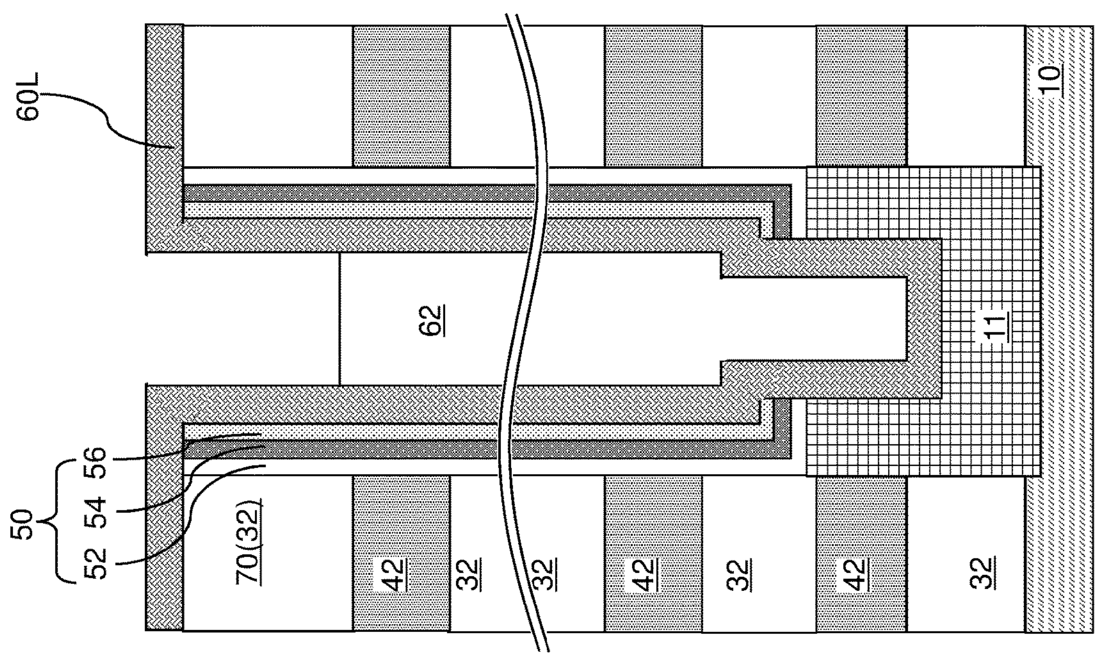

Referring to FIG. 12G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 12H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

Each adjoining set of a blocking dielectric layer 52, a memory material layer 54, and a memory isolation layer 56 collectively constitute a memory film 50, which can store electrical charges or ferroelectric polarization with a macroscopic retention time. As used herein, a macroscopic retention time refers to a retention time suitable for operation of a memory device as a permanent memory device such as a retention time in excess of 24 hours. In some embodiments, a blocking dielectric layer 52 may not be present in the memory film 50 at this step, and a backside blocking dielectric layer may be subsequently formed after formation of backside recesses.

Each combination of a memory film 50 and a vertical semiconductor channel 60 within a memory opening 49 constitutes a memory stack structure 55. In one embodiment, the memory stack structure 55 may comprise a combination of a vertical semiconductor channel 60, a memory isolation layer 56, a plurality of memory elements comprising portions of the memory material layer 54 that are located at the levels of the sacrificial material layers 42, and an optional blocking dielectric layer 52. An entire set of material portions that fills a memory opening 49 is herein referred to as a memory opening fill structure 58.

Generally, a memory opening fill structure 58 can be formed in each memory opening 49. The memory opening fill structure 58 comprises an optional blocking dielectric layer 52, a memory material layer 54, an optional memory isolation layer 56, and a vertical semiconductor channel 60. A memory isolation layer 56 may laterally surround the vertical semiconductor channel 60. The memory material layer 54 can laterally surround the memory isolation layer 56.

Figure 13:
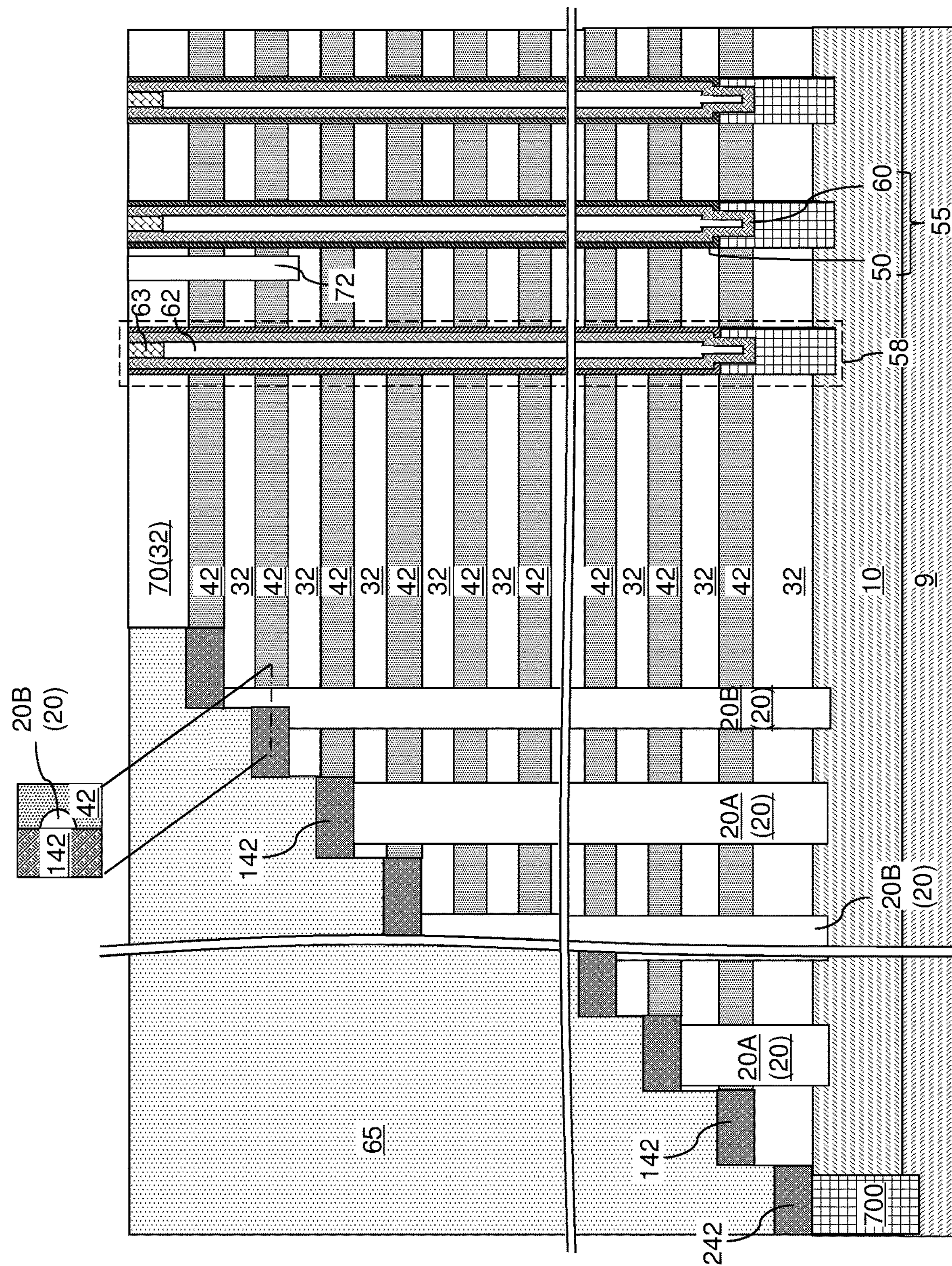
FIG. 13 is a schematic vertical cross-sectional view of the exemplary structure after formation of memory stack structures and support pillar structures according to an embodiment of the present disclosure.

Referring to FIG. 13, the exemplary structure is illustrated after formation of memory opening fill structures 58 within the memory openings 49. Each memory stack structure 55 includes a vertical semiconductor channel 60 and a memory film 50. The memory film 50 may comprise a memory isolation layer 56 laterally surrounding the vertical semiconductor channel 60, a vertical stack of charge storage regions (comprising portions of memory material layer 54) laterally surrounding the memory isolation layer 56, and an optional blocking dielectric layer 52. Other different memory stack structures including different layer stacks or structures for the memory film 50 and/or for the vertical semiconductor channel 60 may be used.

Figure 14A:
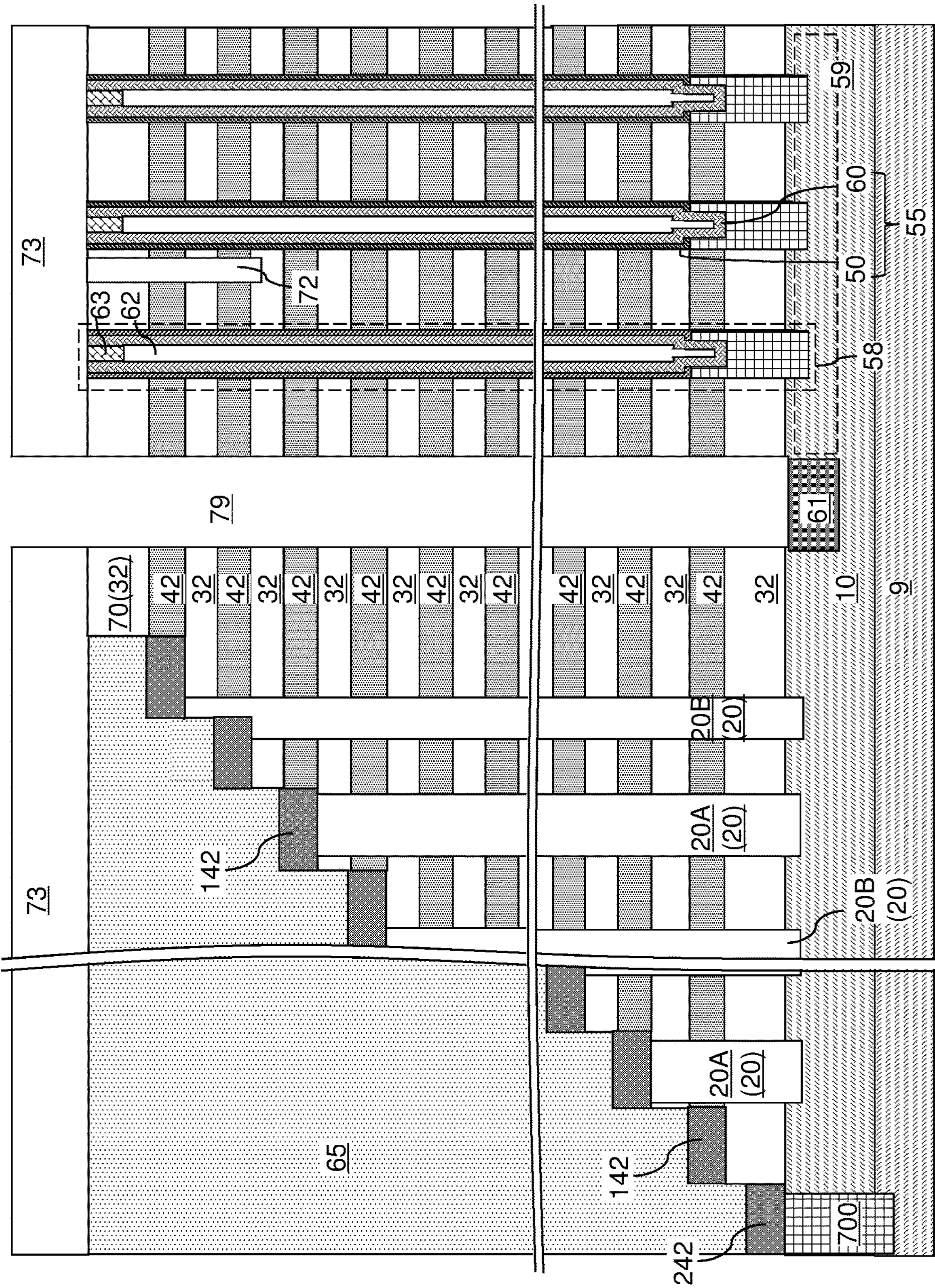
FIG. 14A is a schematic vertical cross-sectional view of the exemplary structure after formation of backside trenches and source regions according to an embodiment of the present disclosure.
Figure 14B:
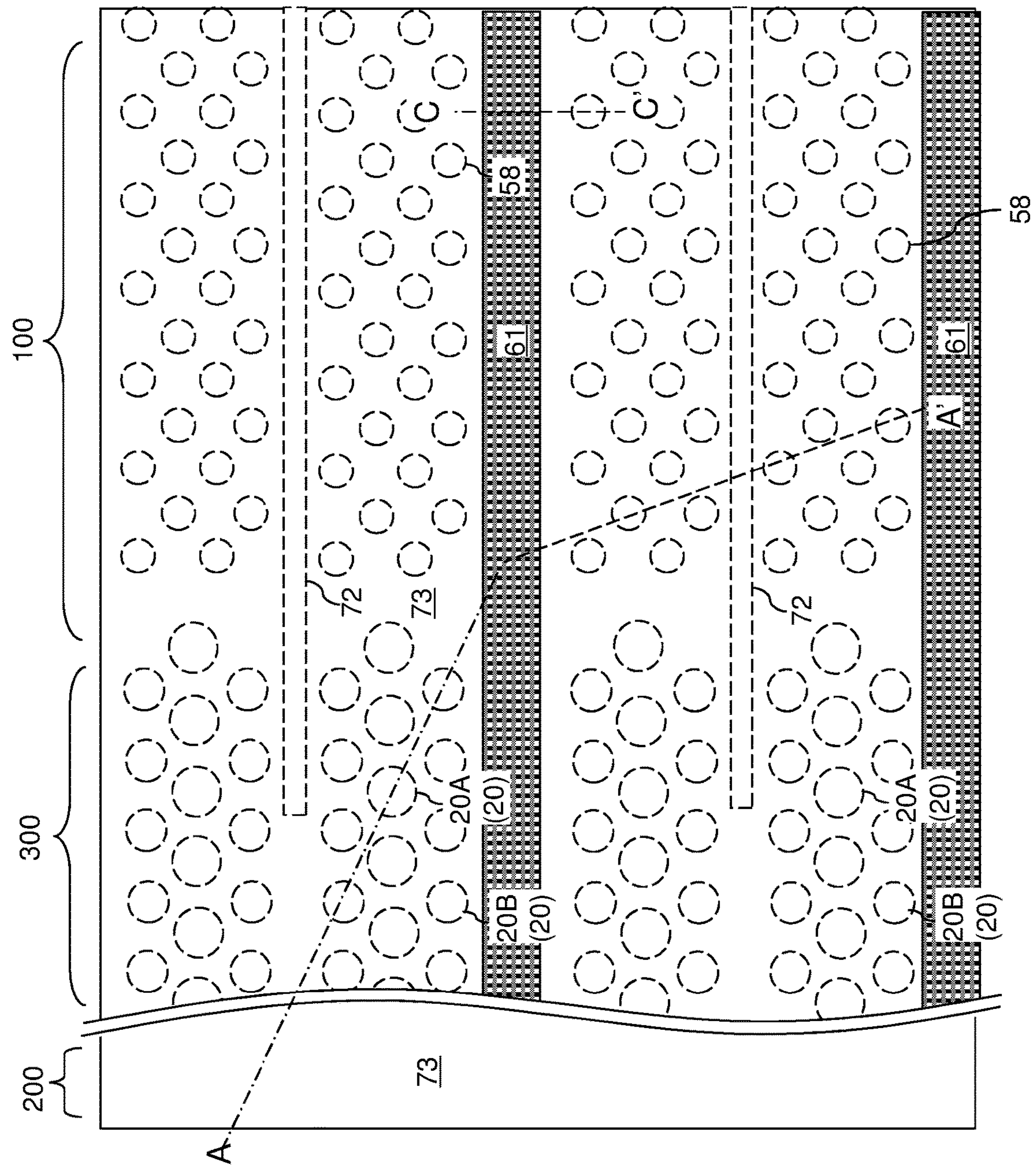
FIG. 14B is a partial see-through top-down view of the exemplary structure of FIG. 14A. The vertical plane A-A' is the plane of the schematic vertical cross-sectional view of FIG. 14A.
Figure 14C:
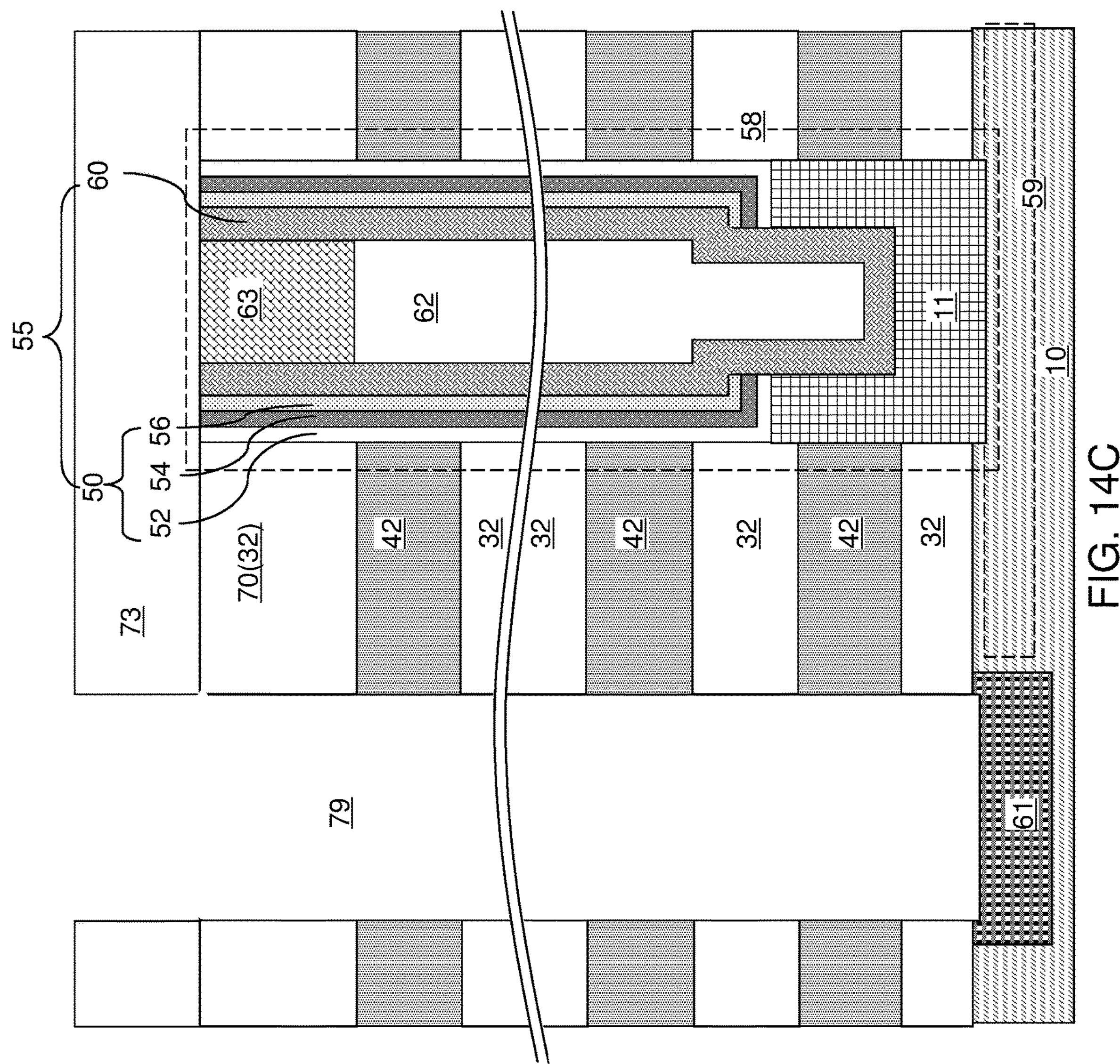
FIG. 14C a schematic vertical cross-sectional view of the exemplary structure along the vertical plane C-C' of FIG. 14B.

Referring to FIGS. 14A-14C, a contact-level dielectric layer 73 can be formed over the alternating stack (32, 42) of insulating layer 32 and sacrificial material layers 42, and over the memory opening fill structures 58 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory opening fill structures 58. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along the first horizontal direction hd1 and can be laterally spaced apart among one another along the second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside trench 79 by implantation of electrical dopants into physically exposed surface portions of the semiconductor material layer 10. An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11.

Figure 15A:
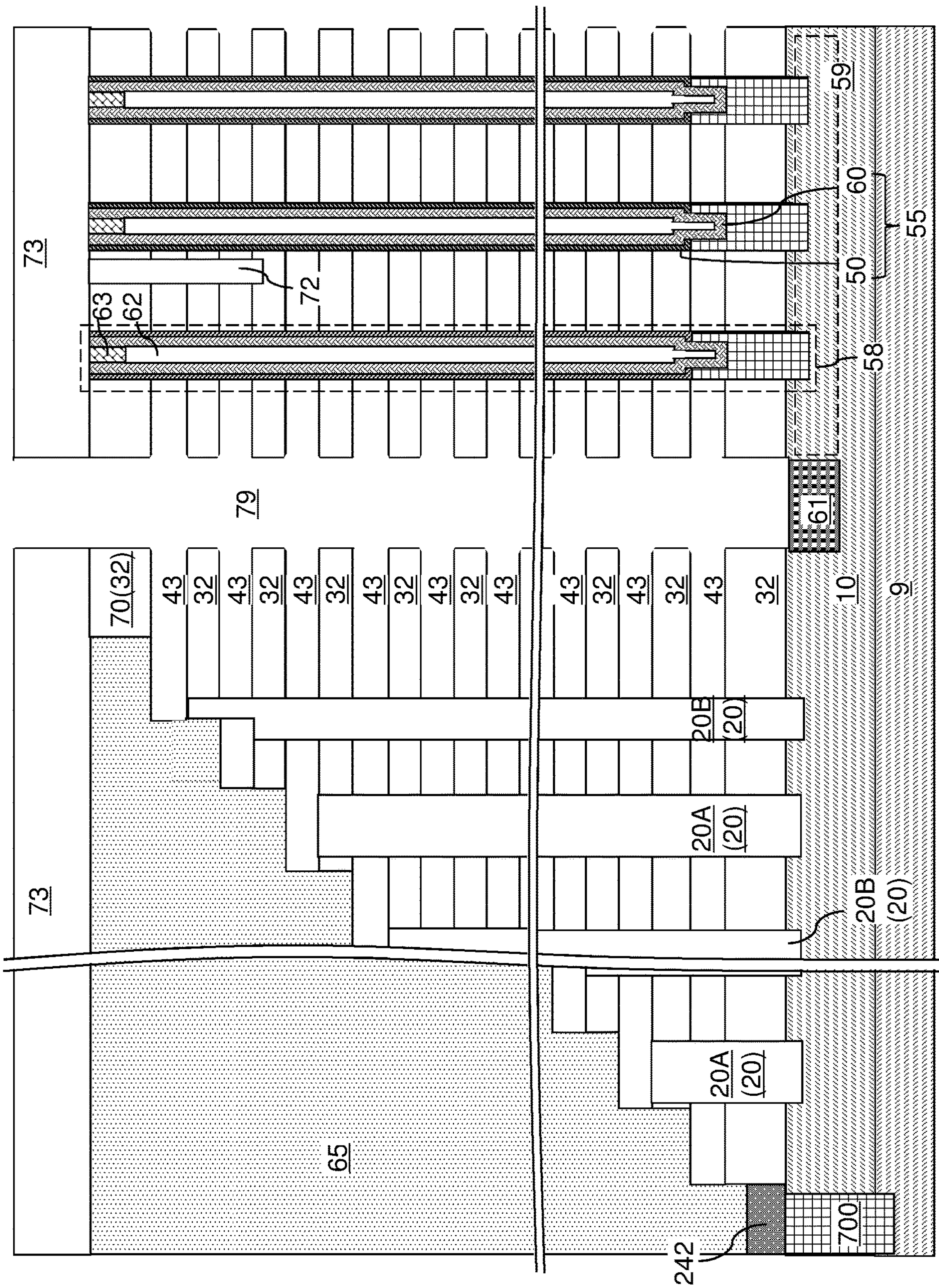
FIG. 15A is a schematic vertical cross-sectional view of the exemplary structure after formation of backside recesses according to an embodiment of the present disclosure.
Figure 15B:
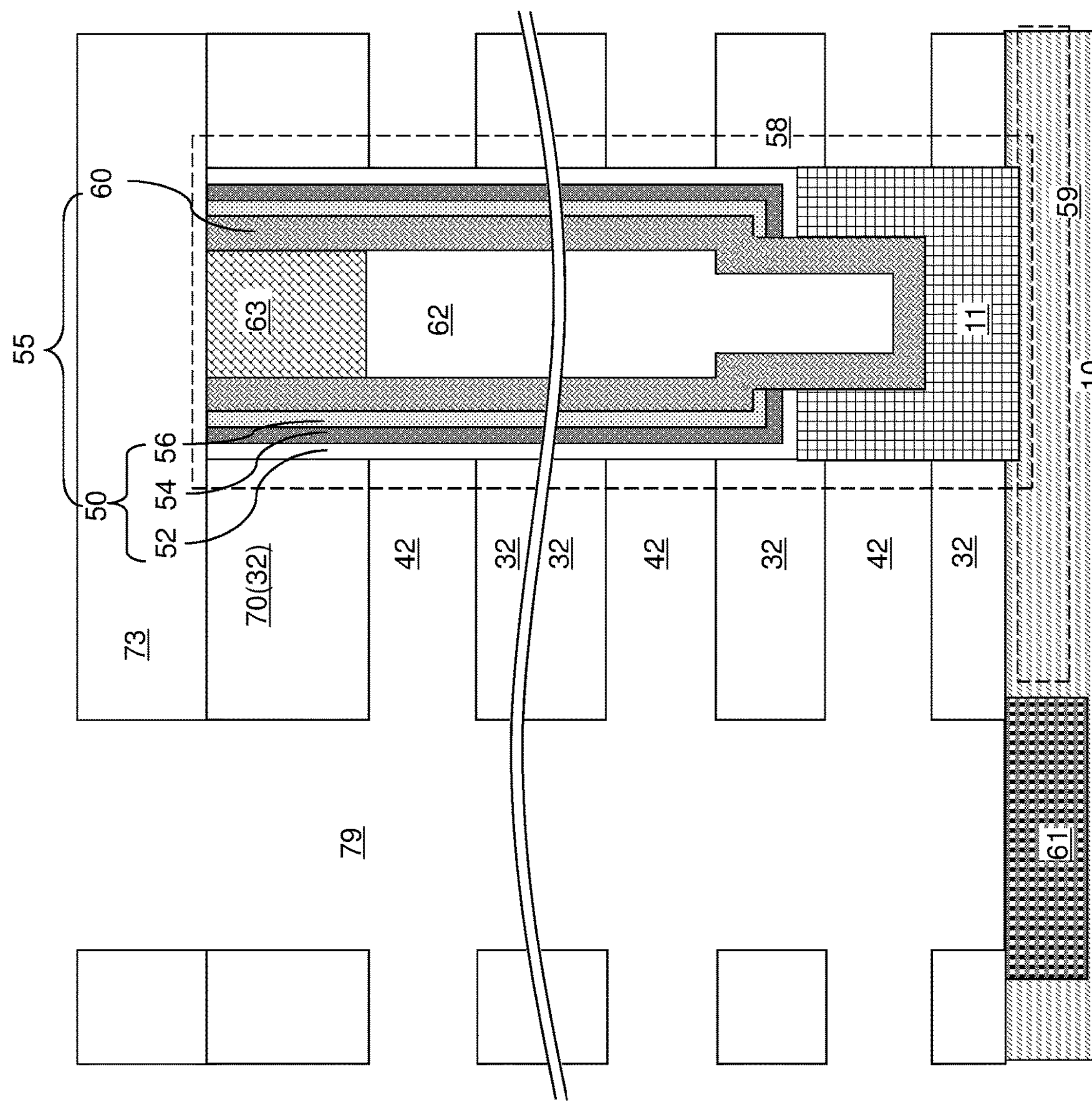
FIG. 15B is a magnified view of a region of the exemplary structure of FIG. 15A.

Referring to FIGS. 15A and 15B, an etchant that selectively etches the materials of the sacrificial material layers 42 with respect to the material of the insulating layers 32 can be introduced into the backside trenches 79, for example, employing an etch process. In one embodiment, the sacrificial pad structures 142 may comprise the same material as the sacrificial material layers 42, and the sacrificial pad structures 142 may be removed concurrently with removal of the sacrificial material layers 142.

Backside recesses 43 are formed in volumes from which the sacrificial material layers 42 are removed. The removal of the second material of the sacrificial material layers 42 and the sacrificial pad structures 142 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 and the sacrificial pad structures 142 can include silicon nitride, and the materials of the insulating layers 32 and the retro-stepped dielectric material portion 65 can be selected from silicon oxide and dielectric metal oxides.

The etch process that removes the sacrificial material layers 42 and the sacrificial pad structures 142 selective to the materials of the insulating layers 32 and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 and the sacrificial pad structures 142 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures 58 provide structural support while the backside recesses 43 are present within volumes previously occupied by the sacrificial material layers 42.

In another embodiment, the sacrificial pad structures 142 may comprise a different material than the sacrificial material layers 42. In this case, the chemistry of the isotropic etch process may be selected such that the etchant simultaneously etches the materials of the sacrificial material layers 42 and the sacrificial pad structures 142 selective to the material of the insulating layers 32. Alternatively, two isotropic etch processes may be sequentially performed. For example, a first isotropic etch process may be performed to remove the material of the sacrificial material layers 42 selective to the material of the insulating layers 32, and the second isotropic etch process may be performed to remove the material of the sacrificial pad structures 142 selective to the material of the insulating layers 32.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. The height of the end portions of the backside recesses 43 that are formed by removal of the sacrificial pad structures 142 may be greater than, maybe less than, or may be the same as, the height of the portions of the backside recesses 43 having an areal overlap with a respective overlying insulating layer 32 in a plan view.

Figure 16A:
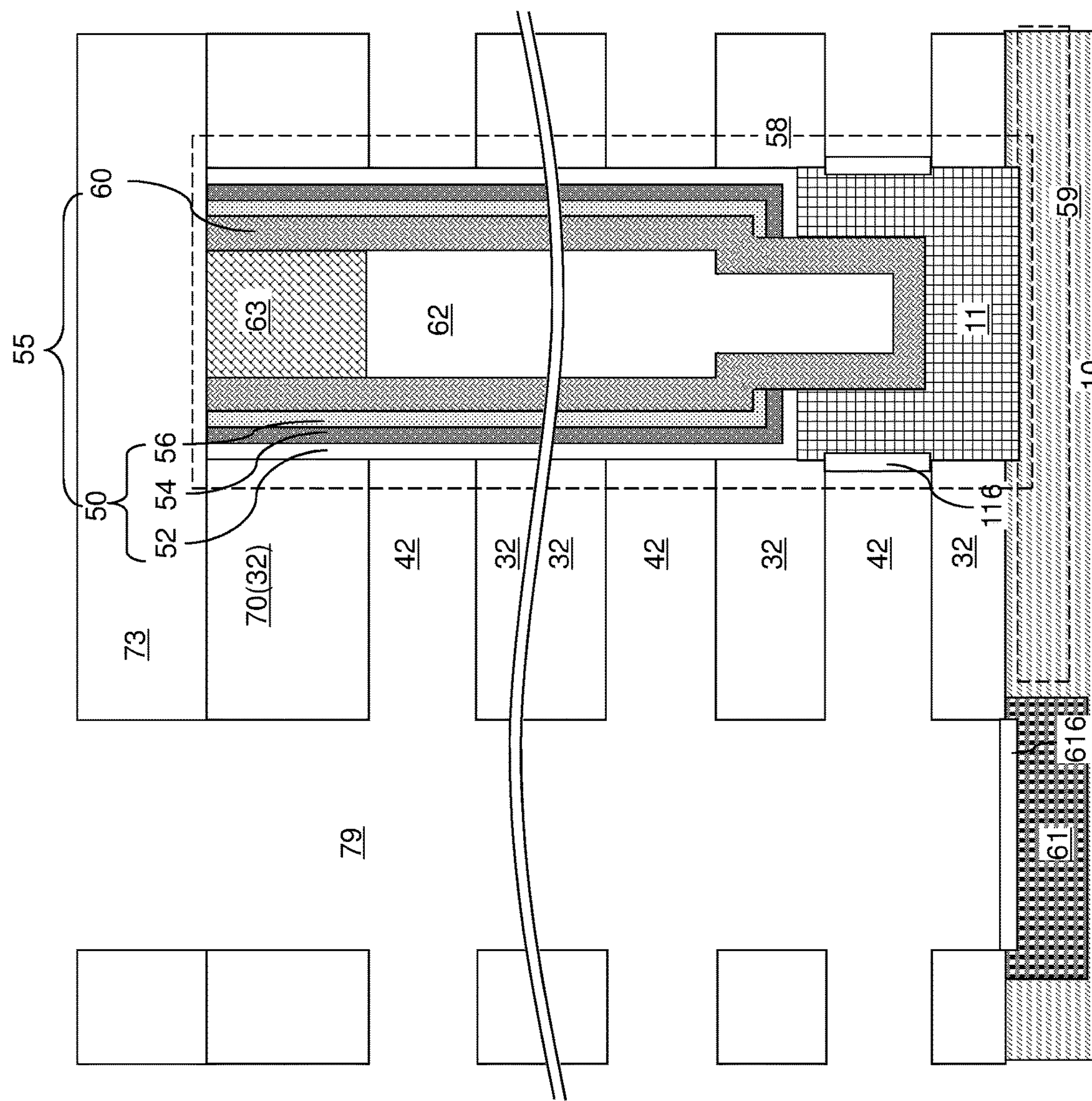
FIGS. 16A-16C are sequential vertical cross-sectional views of a region of the exemplary structure during formation of electrically conductive layers according to an embodiment of the present disclosure.

Referring to FIG. 16A, physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 16B:
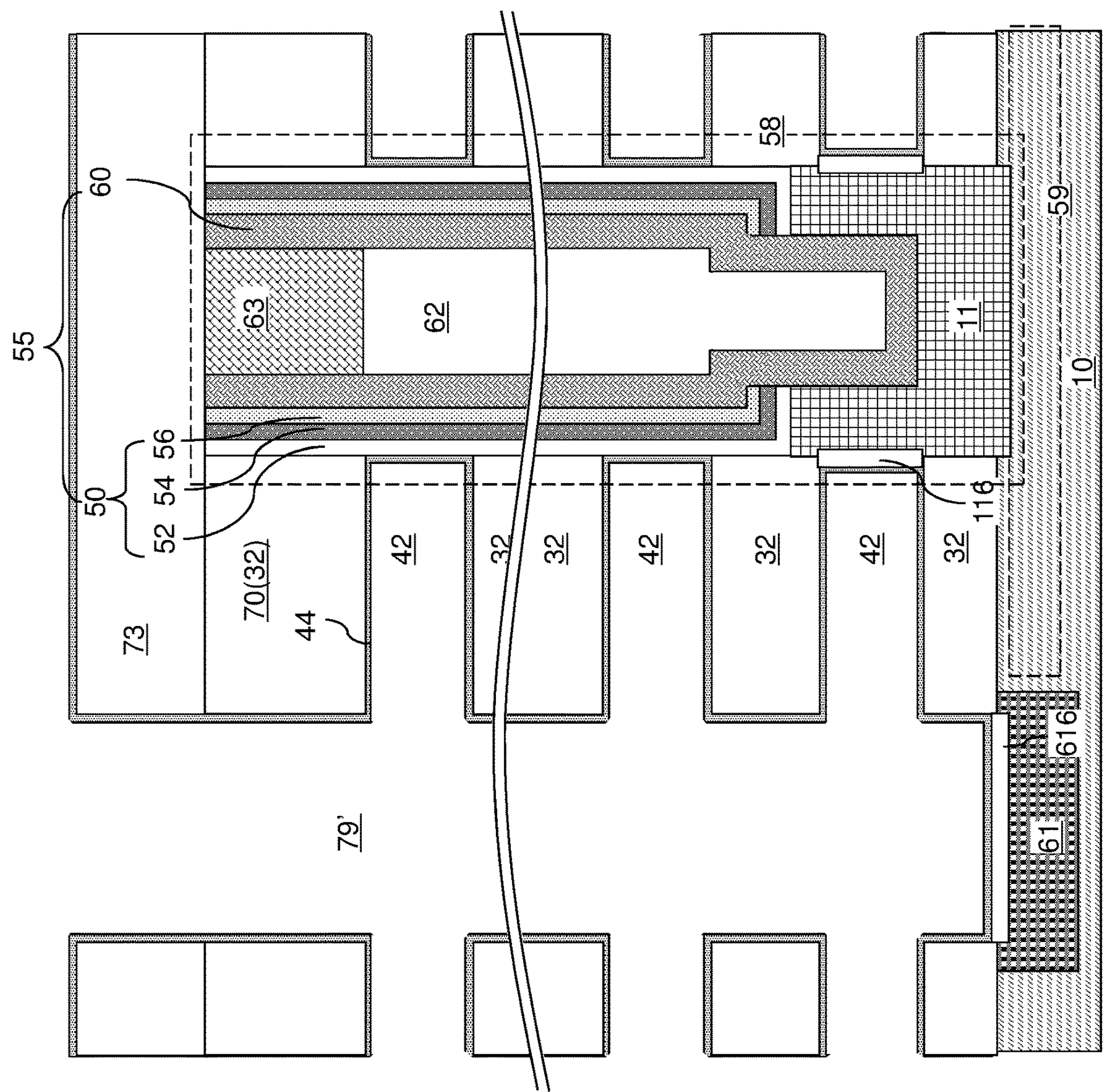

Referring to FIG. 16B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figure 16C:
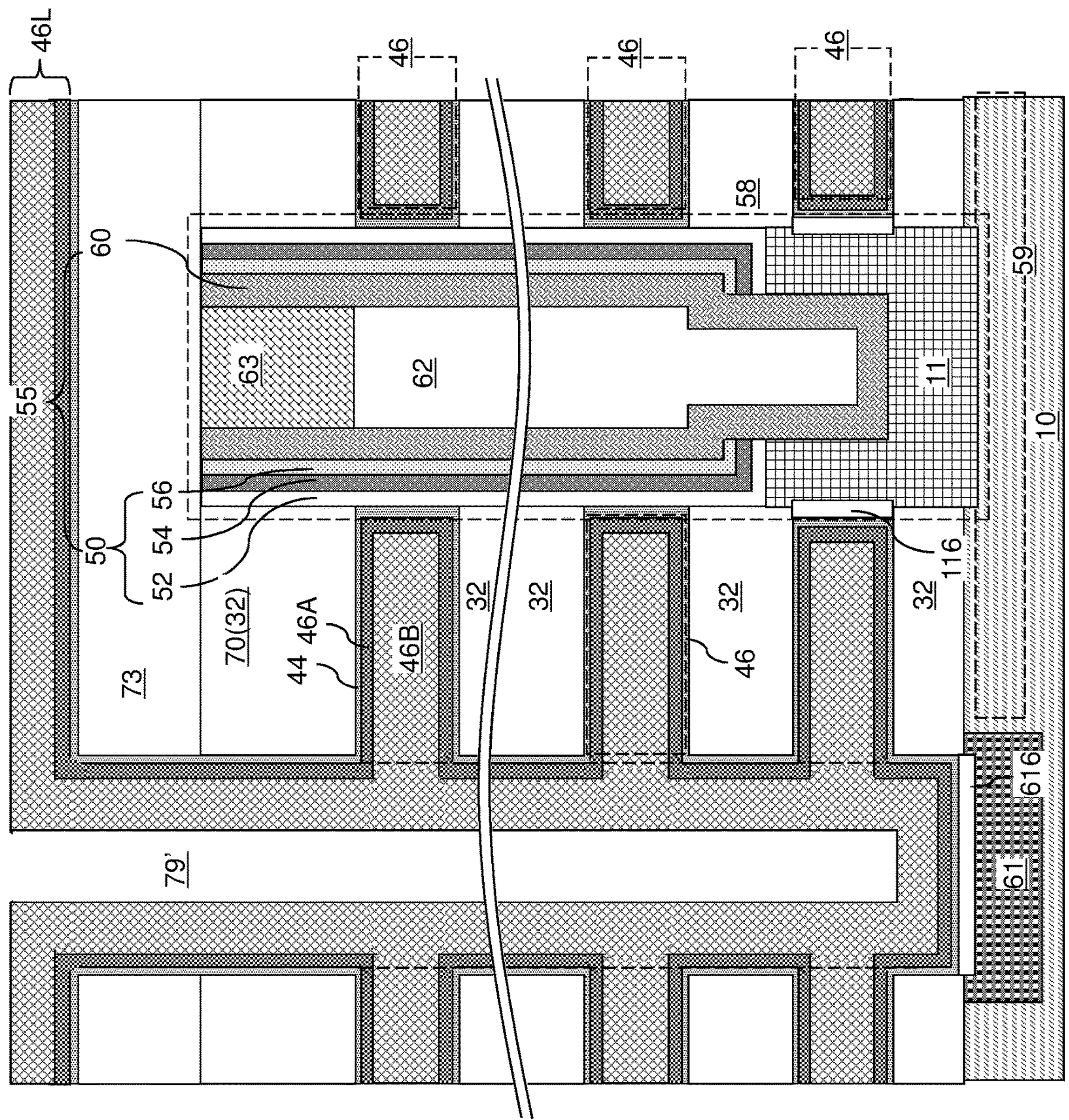

Referring to FIG. 16C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Referring to FIGS. 9D and 10, a metal fill material is deposited in the plurality of backside recesses 43, on the sidewalls of the at least one the backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 17A:
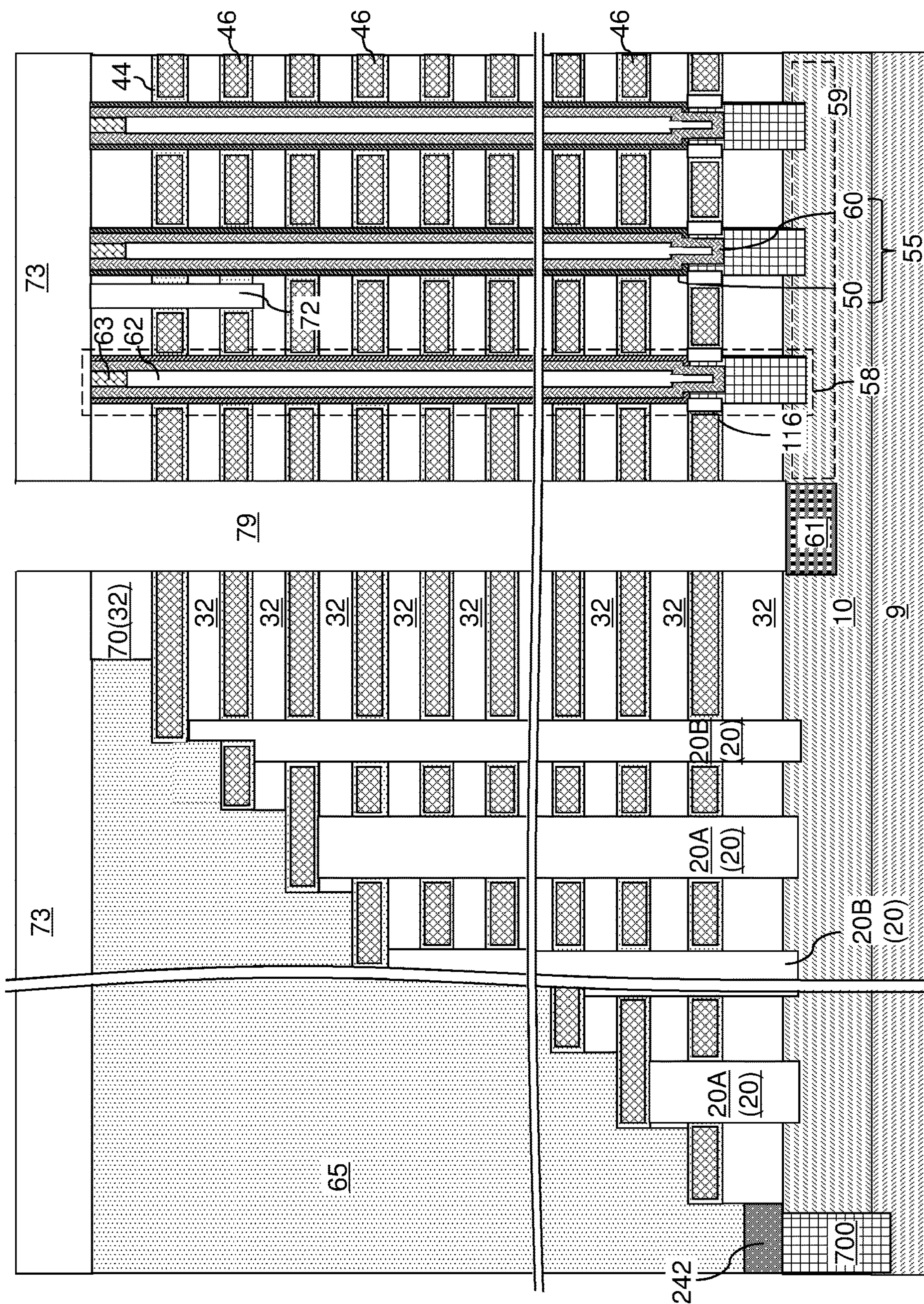
FIG. 17A is a schematic vertical cross-sectional view of the exemplary structure after removal of a deposited conductive material from within the backside trench according to an embodiment of the present disclosure.
Figure 17B:
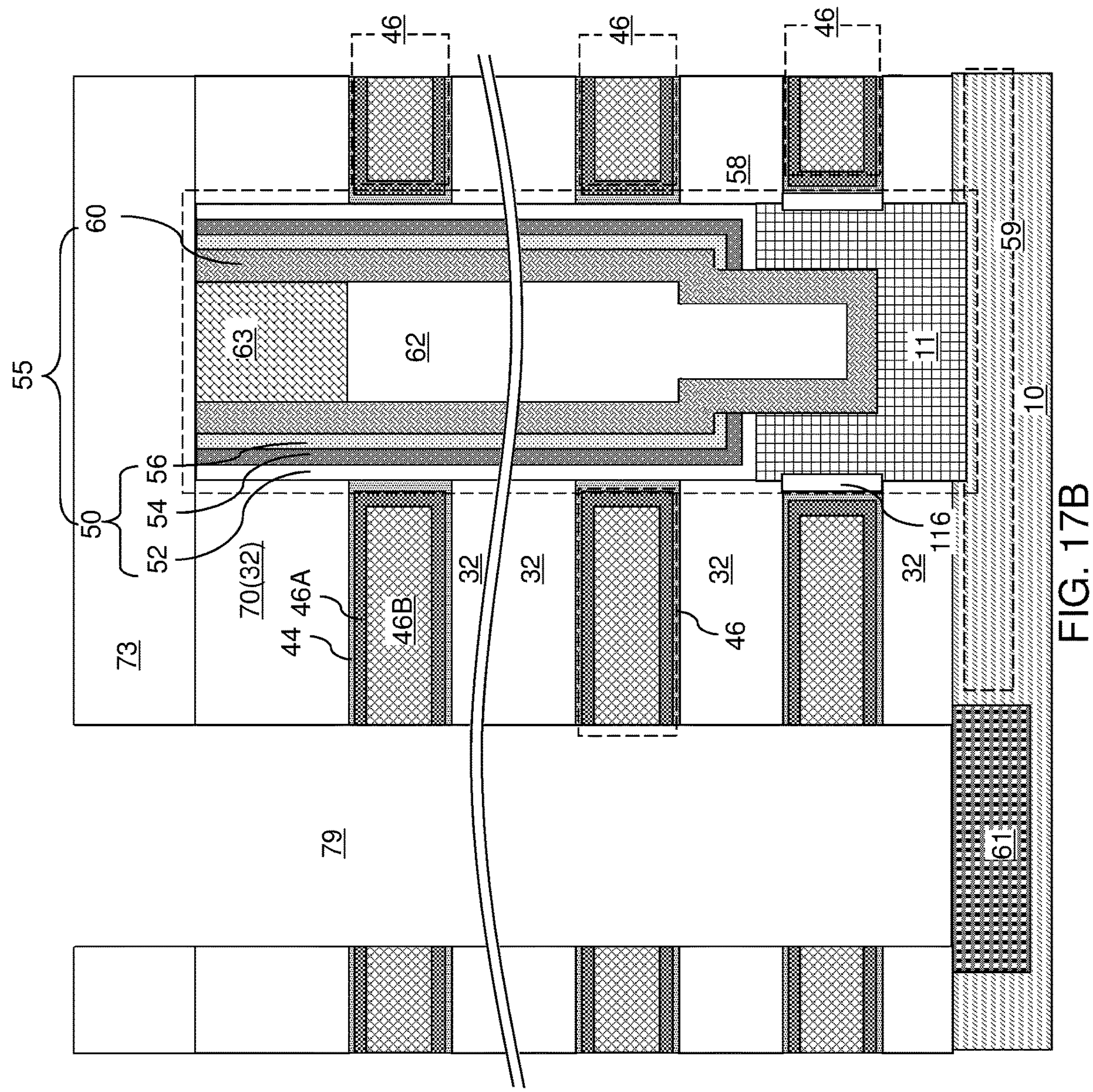
FIG. 17B is a magnified view of a region of the exemplary structure of FIG. 17A.

Referring to FIGS. 17A and 17B, the deposited metallic material of the continuous electrically conductive material layer 46L is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity is present within each backside trench 79.

One or more bottommost electrically conductive layer 46 provided upon formation of the electrically conductive layers 46 within the alternating stack (32, 46) can comprise a source side select gate electrode for the vertical NAND strings. One or more topmost electrically conductive layer 46 provided upon formation of the electrically conductive layers 46 within the alternating stack (32, 46) can comprise a drain side select gate electrode for the vertical NAND strings. The remaining electrically conductive layers 46 can function as word lines. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

Figure 18:
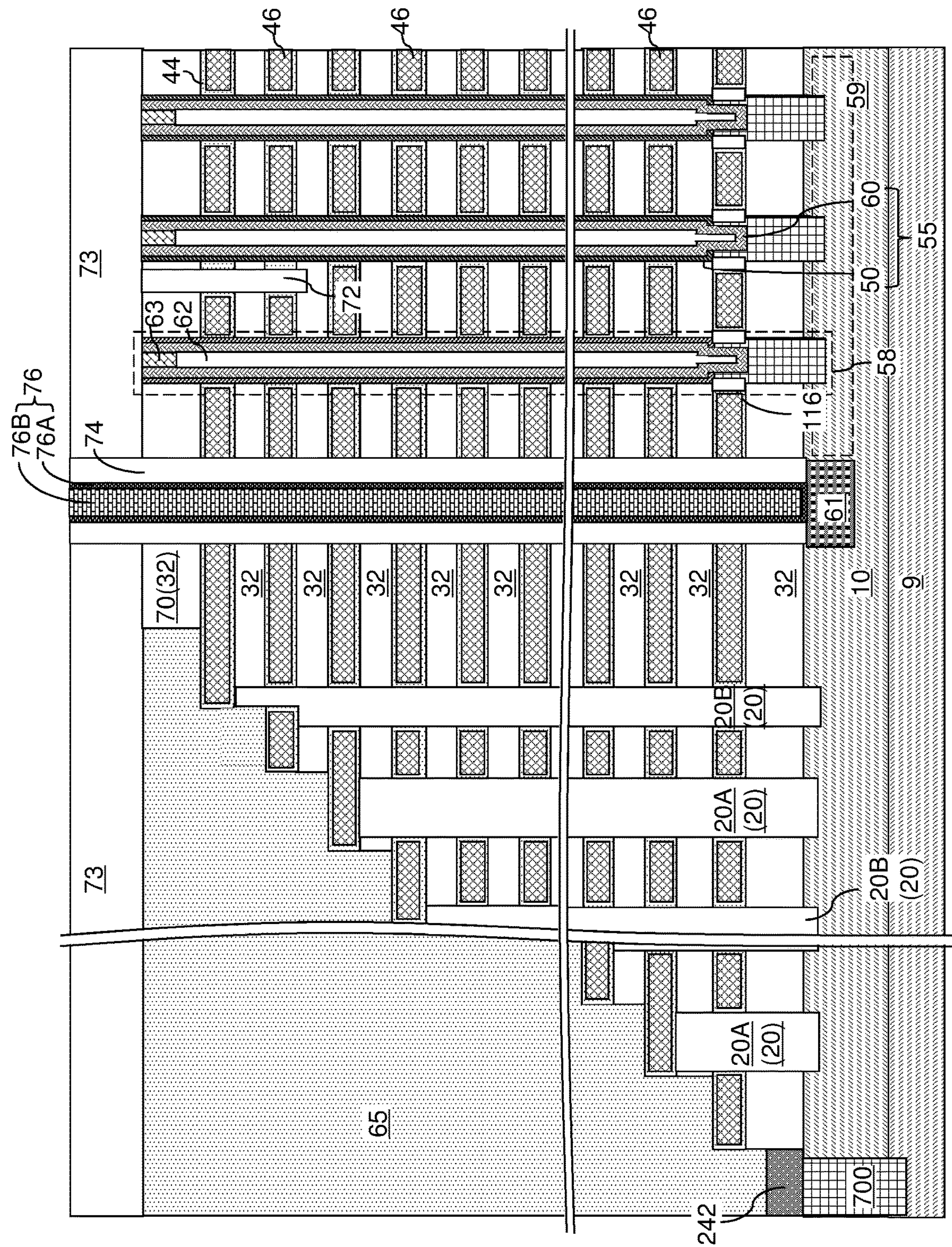
FIG. 18 is a schematic vertical cross-sectional view of the exemplary structure after formation of an insulating spacer and a backside contact structure according to an embodiment of the present disclosure.

Referring to FIG. 18, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench 79.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 19:
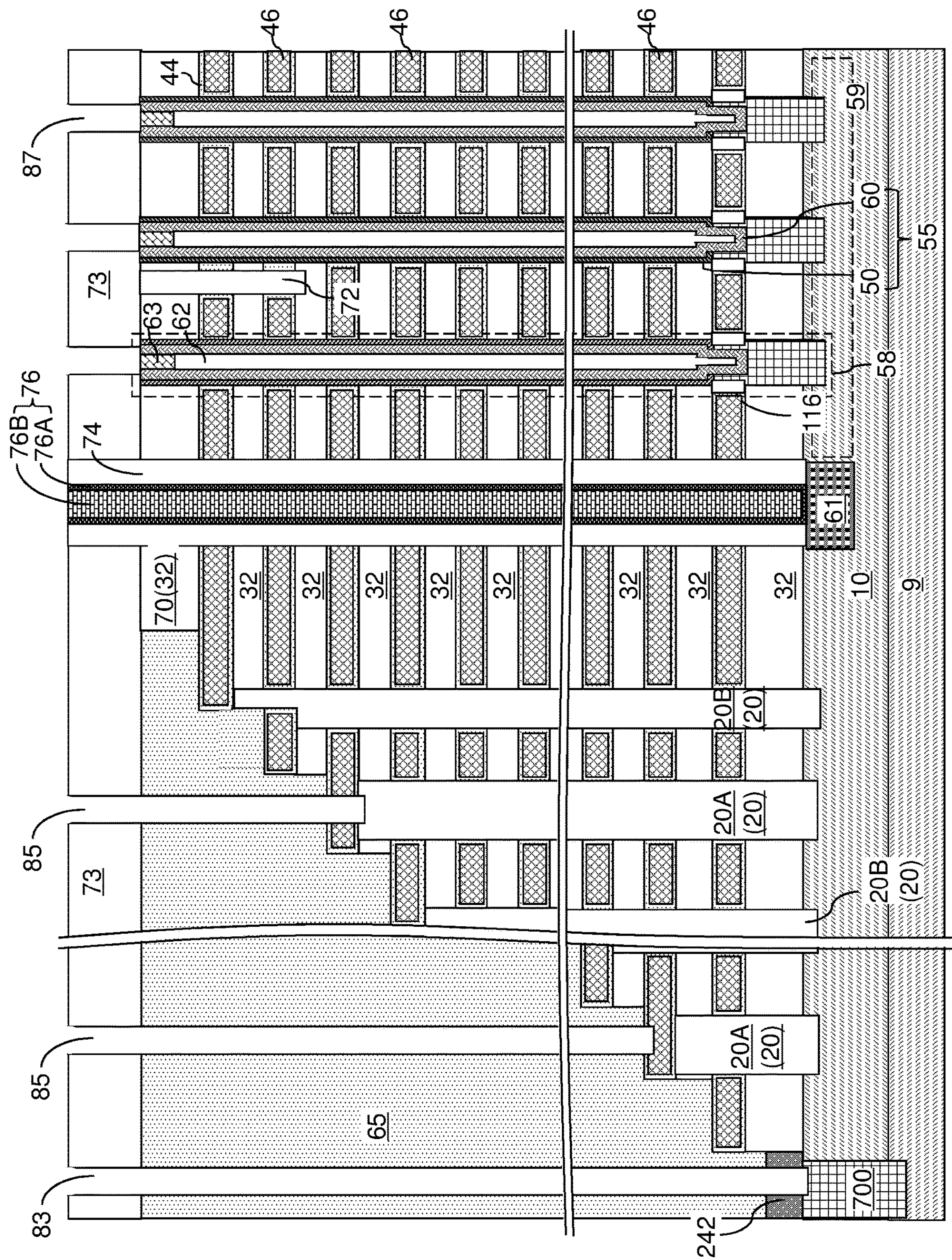
FIG. 19 is a schematic vertical cross-sectional view of the exemplary structure after formation of contact via cavities according to an embodiment of the present disclosure.

Referring to FIG. 19, various contact via cavities (83, 85, 87) can be formed through the contact-level dielectric layer 73 and optionally through the retro-stepped dielectric material portion 65. For example, a first photoresist layer (not shown) can be applied over the top surface of the contact-level dielectric layer 73, and can be lithographically patterned to form discrete openings therein. The discrete openings may comprise openings that are formed in the contact region 300 and optional openings that are formed in the peripheral region 200. According to an aspect of the present disclosure, the size and a location of the openings that are formed in the contact region 300 can be selected such that the periphery of the each opening is located entirely within the area of a respective underlying first support pillar structure 20A. In other words, all openings in the photoresist layer in the contact region 300 can be formed entirely within the area of a respective underlying first support pillar structure 20A. Thus, the periphery of each opening in the photoresist layer in the contact region 300 can be laterally offset inward from the periphery of a horizontal cross-sectional area of a respective underlying first support pillar structure 20A.

An anisotropic etch process can be performed to transfer the pattern of the openings in the photoresist layer through the contact-level dielectric layer 73 and through the retro-stepped dielectric material portion 65. The electrically conductive layers 46 and optional components of the at least one semiconductor device 700 can function as stopping structures for the anisotropic etch process. Optional peripheral contact via cavities 83 are formed through the contact-level dielectric layer 73, the retro-stepped dielectric material portion 65, and the dielectric pad material layer 242 such that a top surface of a respective component of the at least one semiconductor device 700 is a physically exposed. Layer-contact via cavities 85 are formed through the contact-level dielectric layer 73, the retro-stepped dielectric material portion 65, and an optional respective backside blocking dielectric layer 44 such that a surface of a respective electrically conductive layer 46 is physically exposed.

Generally, electrically conductive layers 46 that are more distal from the substrate (9, 10) are exposed to the etchants employed during the anisotropic etch process for a longer duration of time, and electrically conductive layers 46 that are more proximal to the substrate (9, 10) are exposed to the etchants employed it during the anisotropic etch process for a shorter duration of time. In case the total number of the electrically conductive layers 46 is a large number, such as a number greater than 64 and/or greater than 128 and/or greater than 256, electrically conductive layers 46 that are distal from the substrate (9, 10) may be collaterally etched during the anisotropic etch process. In some embodiments, one or more of the electrically conductive layers 46 that are distal from the substrate (9, 10) may be etched through before termination of the an isotropic etch process, and at least one layer-contact via cavity 85 may vertically extended through the entire thickness of a respective one of the electrically conductive layers 46 and into low on upper portion of a respective one of the first support pillar structures 20A.

At least one first contact via cavity 85 may vertically extend through a respective first electrically conductive layer 46 and into a top portion of a respective first support pillar structure 20A. For example, a layer-contact via cavity 85 that is formed on a topmost electrically conductive layer 46 (e.g., drain side select gate electrode) may vertically extended through the topmost electrically conductive layer 46 and into a top portion of a first support pillar structure 20A that contacts the bottom of the topmost electrically conductive layer 46, or is vertically spaced of from the topmost electrically conductive layer 46 only by a backside blocking dielectric layer 44.

In contrast, layer-contact via cavities 85 vertically extending to a respective one of the electrically conductive layers (e.g., source side select gate electrodes or lower word lines)

46 that are proximal to the substrate (9, 10) may have a respective bottom surface that coincides with a recessed surface of a respective one of the electrically conductive layers 46. In other words, such cavities 85 may extend only partially through the thickness of the electrically conductive layers 46, or such cavities 85 may terminate on the upper surface of the electrically conductive layers 46. In some cases, the depth of the recessed surface as measured from the top surface of the respective one of the electrically conductive layers 46 may be in a range from 0% to 80%, such as from 1% to 40% and/or from 2% to 20%, of the thickness of such respective electrically conductive layer 46 (e.g., the bottommost electrically conductive layer 46).

Thus, at least one second contact via cavity 85 may vertically extend into a top portion of a respective second electrically conductive layer 46 and does not vertically extend all the way through the respective second electrically conductive layer 46. For example, a layer-contact via cavity 85 that is formed on a bottommost electrically conductive layer 46 (e.g., source side select gate electrode) may vertically extend into a top portion of the bottommost electrically conductive layer 46 and does not reach the bottom surface of the bottommost electrically conductive layer 46. The first photoresist layer may be subsequently removed, for example, by ashing.

In one embodiment, the first layer-contact via cavity 85 has a bottom surface that is located entirely inside, and is laterally offset inward from, a periphery of a topmost surface of a first support pillar structure 20A of the support pillar structures 20 in a plan view along a vertical direction. In one embodiment, the first layer-contact via cavity 85 is formed directly on the first support pillar structure 20A such that a recessed surface of the first support pillar structure 20A is physically exposed to the first layer-contact via cavity 85.

In one embodiment, the second layer-contact via cavity 85 vertically extends into a second electrically conductive layer 46, and a bottom surface of the second layer-contact via cavity 85 is located entirely inside and is laterally offset inward from a periphery of a topmost surface of a second support pillar structure (i.e., another first support pillar structure 20A) in the plan view. The bottom surface of the second layer-contact via cavity 85 is located above a horizontal plane including a bottom surface of the second electrically conductive layer 46.

A second photoresist layer may be applied to over the contact-level dielectric material layer 73, and may be lithographically patterned to form an array of openings having a same pattern as the of array of drain regions 63. Another anisotropic etch process may be performed to form drain-contact via cavities 87 that vertically extends from the top surface of the contact-level dielectric layer 73 to a top surface of a respective one of the drain regions 63. The second photoresist layer may be subsequently removed, for example, by ashing. In an alternative embodiment, the drain-contact via cavities 87, the layer-contact via cavities 85, and a peripheral contact via cavities 87 may be formed concurrently employing a single lithographic patterning process and a single anisotropic etch process.

Referring to FIGS. 20A-20E, at least one conductive material up can be deposited in the various contact via cavities (83, 85, 87). For example, the at least one conductive material can include a conductive liner material and a conductive fill material. The conductive liner material can include a conductive metallic liner such as TiN, TaN, WN, TiC, TaC, WC, an alloy thereof, or a stack thereof. The thickness of the conductive liner material can be in a range from 3 nm to 30 nm, although lesser and greater thicknesses can also be employed. The conductive fill material can include a metal or a metallic alloy. For example, the conductive fill material can include W, Cu, Al, Co, Ru, Ni, an alloy thereof, or a stack thereof.

Excess portions of the at least one conductive material can be removed from above the horizontal plane including the top surface of the insulating cap layer 70 by a planarization process. The planarization process may employ a chemical mechanical polishing process and/or a recess etch process. Each remaining portion of the at least one conductive material that fills a peripheral contact via cavity 83 constitutes a peripheral contact via structure 84. Each remaining portion of the at least one conductive material that fills a layer-contact via cavity 85 constitutes a layer-contact via structure 86, which may comprise a word-line contact via structure or a select gate contact via structure contacting an electrically conductive layer 46 that functions as a word line or a select gate electrode, respectively. Each remaining portion of the at least one conductive material that fills a drain-contact via cavity 87 constitutes a drain-contact via structure 88.

Each peripheral contact via structure 84 may comprise a peripheral metallic liner 84A and a peripheral conductive fill material portion 84B. Each layer-contact via structure 86 may comprise a layer-contact metallic liner 86A and a layer-contact conductive fill material portion 86B. Each drain-contact via structure 88 may comprise a drain-contact metallic liner 88A and a drain-contact conductive fill material portion 88B.

Figure 20A:
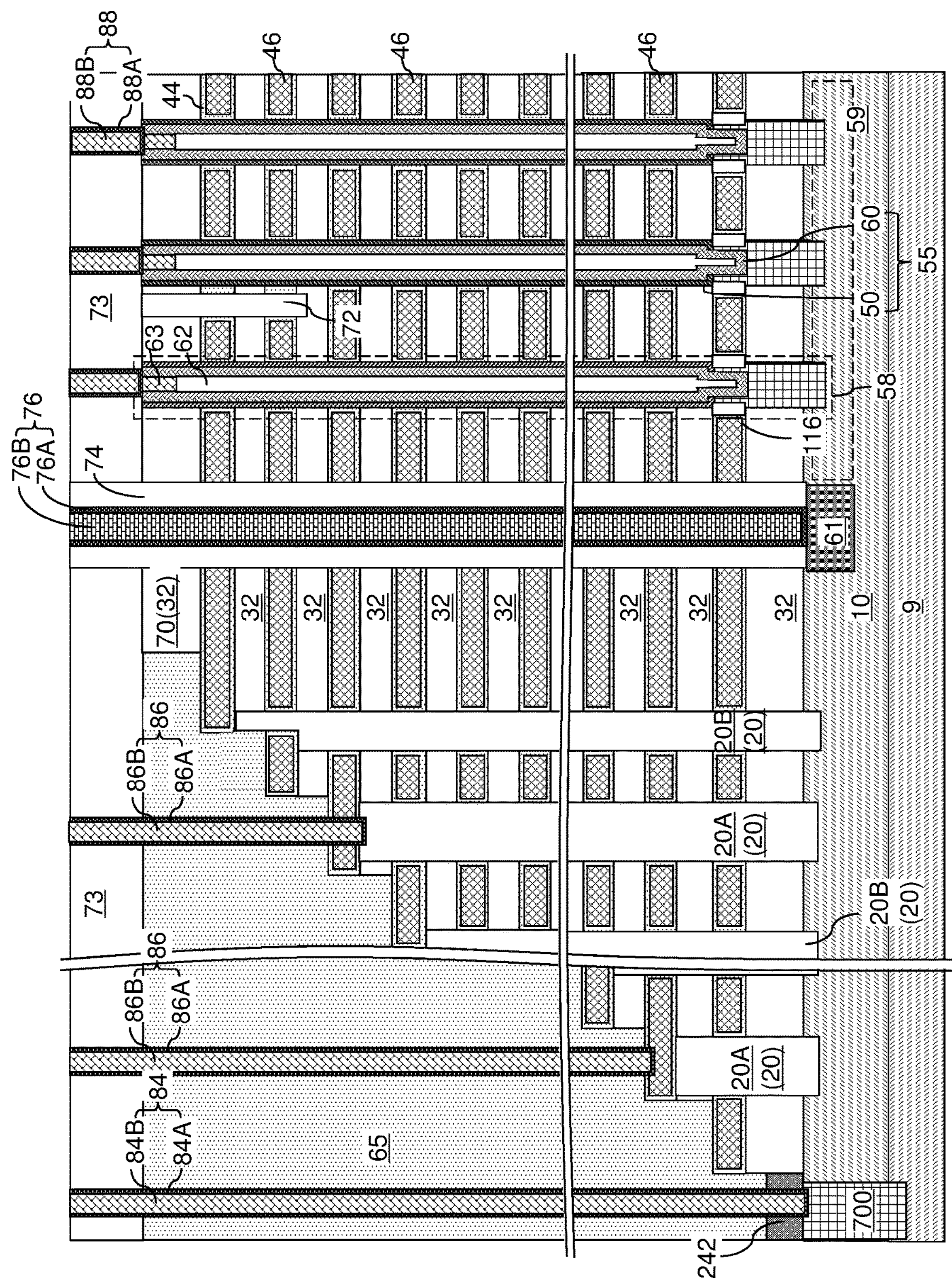
FIG. 20A is a schematic vertical cross-sectional view of the exemplary structure after formation of contact via structures according to an embodiment of the present disclosure.
Figure 20B:
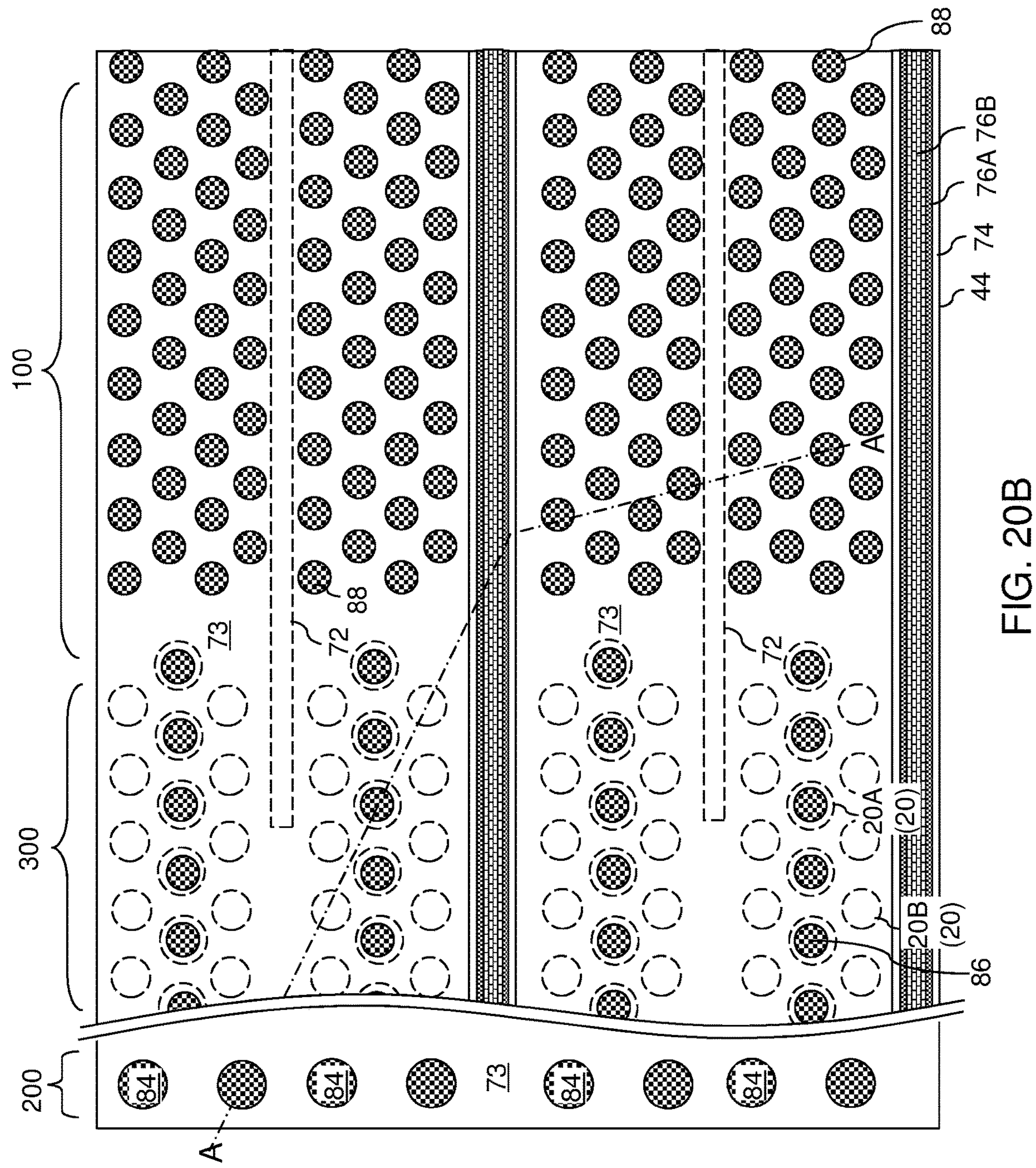
FIG. 20B is a partial see-through top-down view of the exemplary structure of FIG. 20A. The vertical plane A-A' is the plane of the schematic vertical cross-sectional view of FIG. 20A.
Figure 20C:
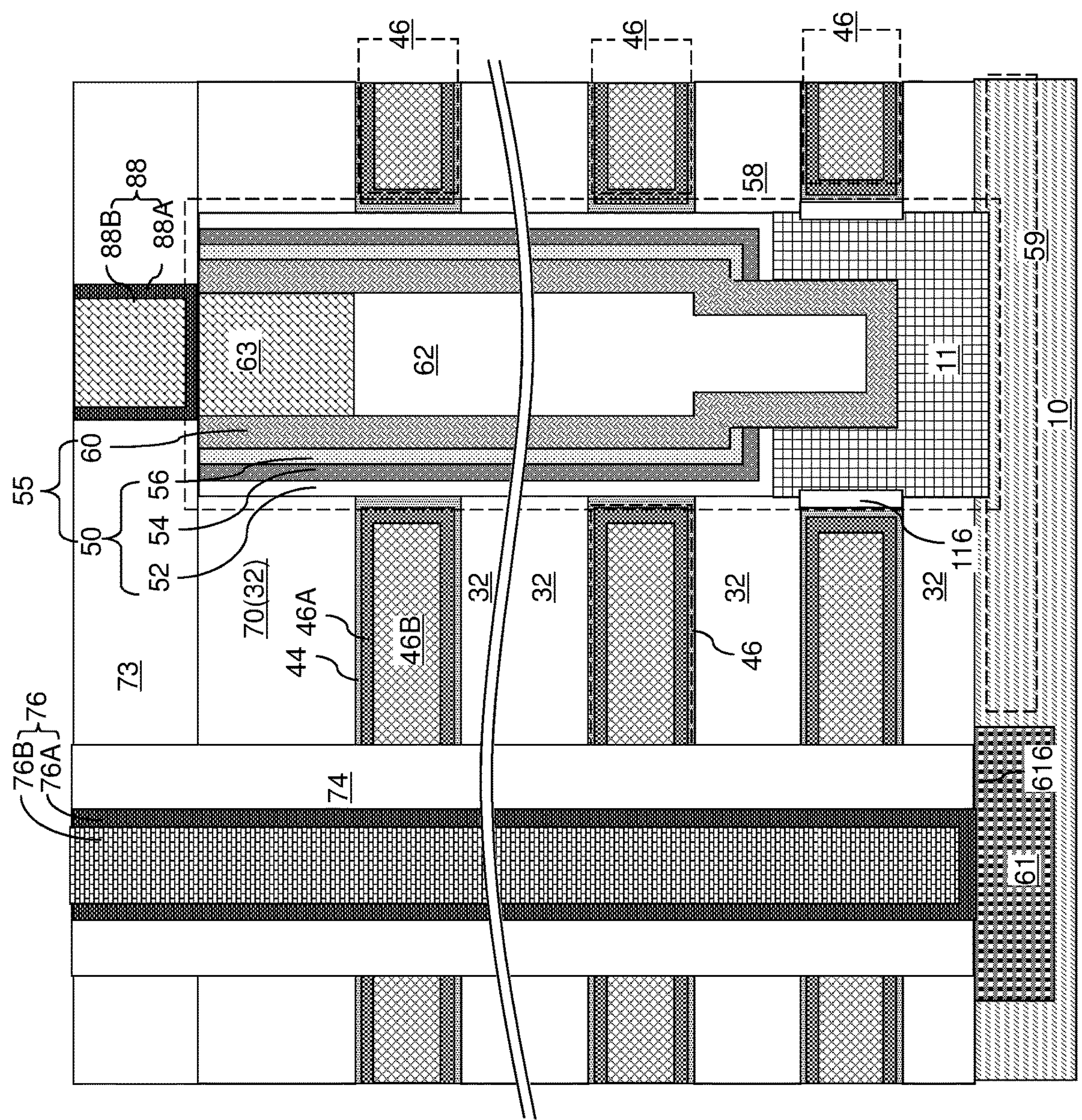
FIG. 20C is a magnified view of a region around a backside trench fill structure in the exemplary structure of FIGS. 20A and 20B.
Figure 20D:
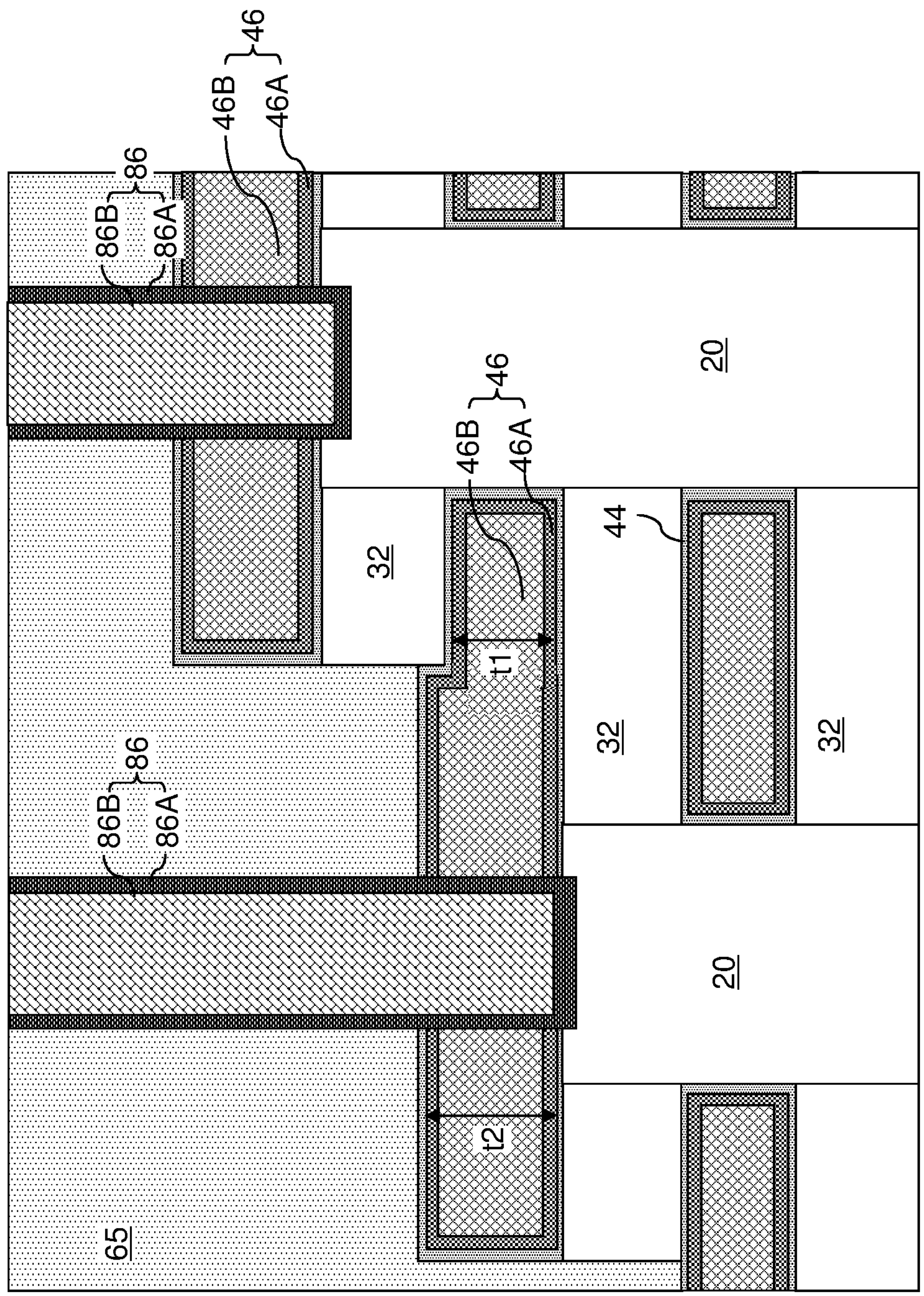
FIG. 20D is a magnified view of a region around a pair of layer-contact via structures in the exemplary structure of FIGS. 20A and 20B.

At least one first layer-contact via structure 86 may vertically extend through a respective first electrically conductive layer 46 and into a top portion of a respective first support pillar structure 20A, as illustrated in FIG. 20D. For example, a layer-contact via structure 85 that is formed on a topmost electrically conductive layer 46 may vertically extended through the topmost electrically conductive layer 46 and into a top portion of a first support pillar structure 20A that contacts the bottom of the topmost electrically conductive layer 46, or is vertically spaced of from the topmost electrically conductive layer 46 only by a backside blocking dielectric layer 44. A plurality of first layer-contact via structures 86 may vertically extend through a respective first electrically conductive layer 46 and into a top portion of a respective first support pillar structure 20A.

Figure 20E:
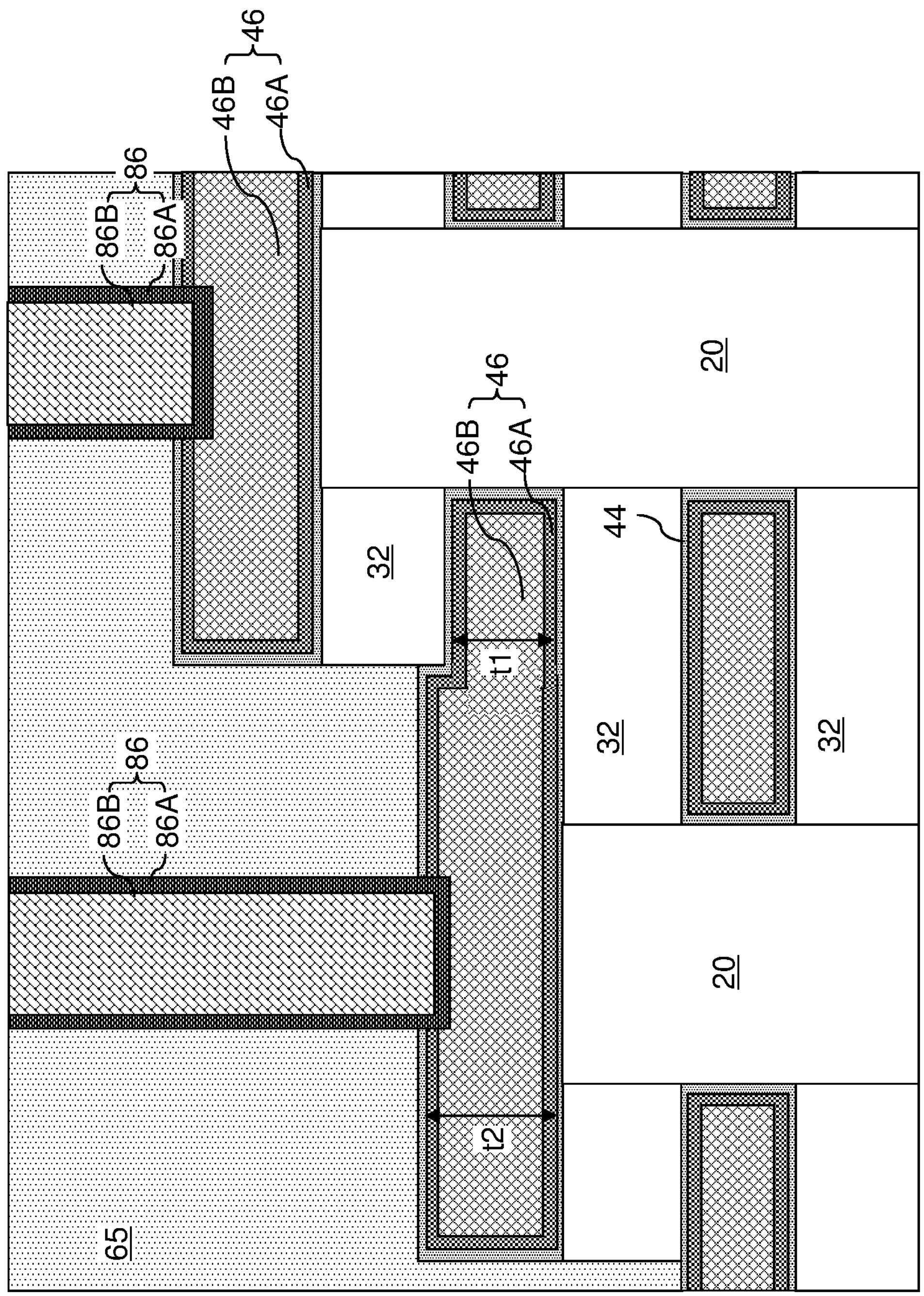
FIG. 20E is a magnified view of a region around another pair of layer-contact via structures in the exemplary structure of FIGS. 20A and 20B.

At least one second layer-contact via structure 86 may vertically extend into a top portion of a respective second electrically conductive layer 46 and does not vertically extend through the second electrically conductive layer 46, as illustrated in FIG. 20E. For example, a layer-contact via structure 86 that is formed on a bottommost electrically conductive layer 46 may vertically extend into a top portion of the bottommost electrically conductive layer 46 and does not reach the bottom surface of the bottommost electrically conductive layer 46. In one embodiment, a plurality of layer-contact via structures 86 may vertically extend into a portion of a respective second electrically conductive layer 86 and do not vertically extend through the respective second electrically conductive layer 46.

In one embodiment, a first layer-contact via structure 86 has a bottom surface that is located entirely inside and is laterally offset inward from a periphery of a topmost surface of a first support pillar structure 20A in a plan view along a vertical direction. In one embodiment, the first layer-contact via structure 86 is formed in the first layer-contact via cavity 85 directly on the first support pillar structure 20A.

In one embodiment, a second layer-contact via structure 86 vertically extends into a second electrically conductive layer 46, and a bottom surface of the second layer-contact via structures 86 is located above topmost surface of a second support pillar structure (i.e., another first support pillar structure 20A), and is also located in the plan view entirely inside and laterally offset inward from a periphery of the topmost surface of the second support pillar structure. The bottom surface of the second layer-contact via structure 86 is located above a horizontal plane including a bottom surface of the second electrically conductive layer 46.

Portions of each electrically conductive layer 46 that contacts a respective layer-contact via structure 86 may be thicker than, thinner than, or of the same thickness as, the portion of the respective electrically conductive layer 46 having an areal overlap with a respective overlying insulating layer 32 in a plan view. In the illustrative example of FIGS. 20D-20E, portions of each electrically conductive layer 46 that contacts a respective layer-contact via structure 86 are thicker than the portion of the respective electrically conductive layer 46 having an areal overlap with a respective overlying insulating layer 32 in the plan view.

In one embodiment shown in FIGS. 20D and 20E, each of the electrically conductive layer 46 comprises a first portion that has an areal overlap with an overlying one of the insulating layers 32 in the alternating stack (32, 46) in the plan view and having a first thickness t1, and a second portion that does not have any areal overlap with the overlying one of the insulating layers 32 in the alternating stack in the plan view and having a second thickness t2. The second thickness t2 may be the same as, or may be different from, the first thickness t1. In one embodiment, the second thickness t2 is greater than the first thickness t1.

Figure 21A:
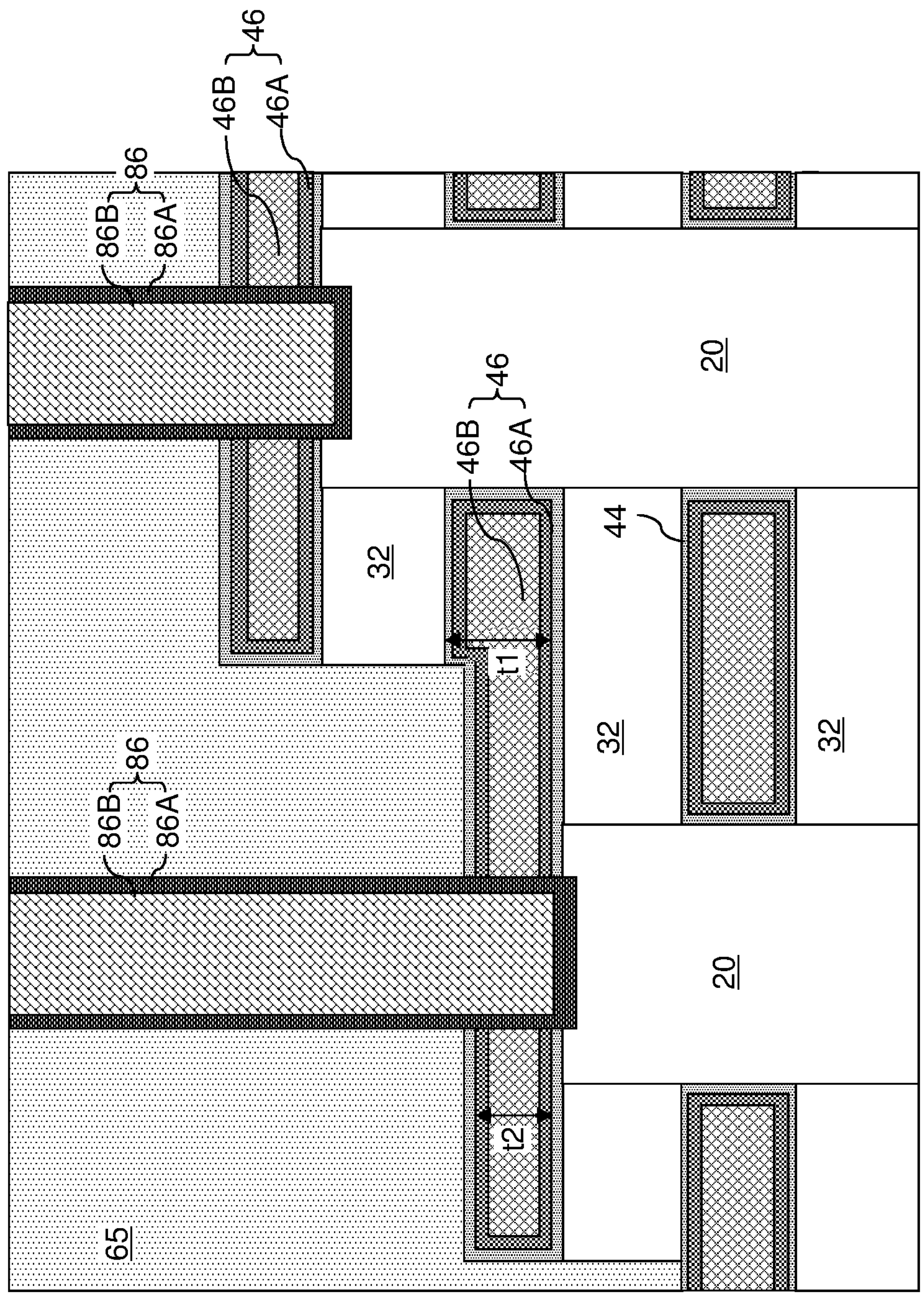
FIG. 21A is a magnified view of a region around a pair of layer-contact via structures in a first alternative configuration of the exemplary structure according to an embodiment of the present disclosure.
Figure 21B:
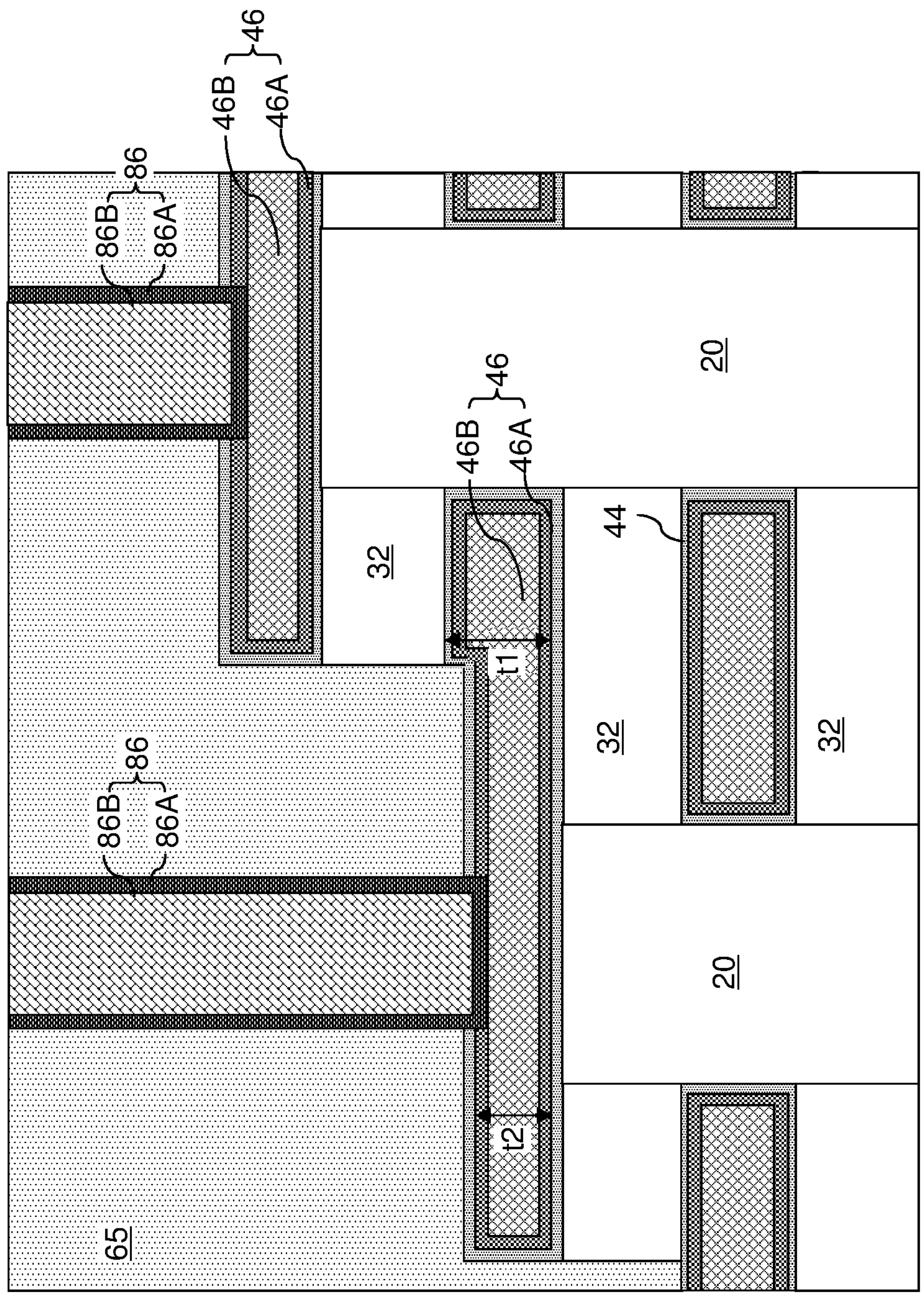
FIG. 21B is a magnified view of a region around another pair of layer-contact via structures in the first alternative configuration of the exemplary structure according to an embodiment of the present disclosure.

Referring to FIGS. 21A and 21B, a first alternative configuration of the exemplary structure may be derived from the exemplary structure of FIGS. 20A-20E by forming sacrificial pad structures 142 having a lesser thickness than the sacrificial material layers 42. In this case, portions of each electrically conductive layer 46 that contacts a respective layer-contact via structure 86 are thinner than the portion of the respective electrically conductive layer 46 having an areal overlap with a respective overlying insulating layer 32 in the plan view. In one embodiment, the second thickness t2 is less than the first thickness t1.

Figure 22A:
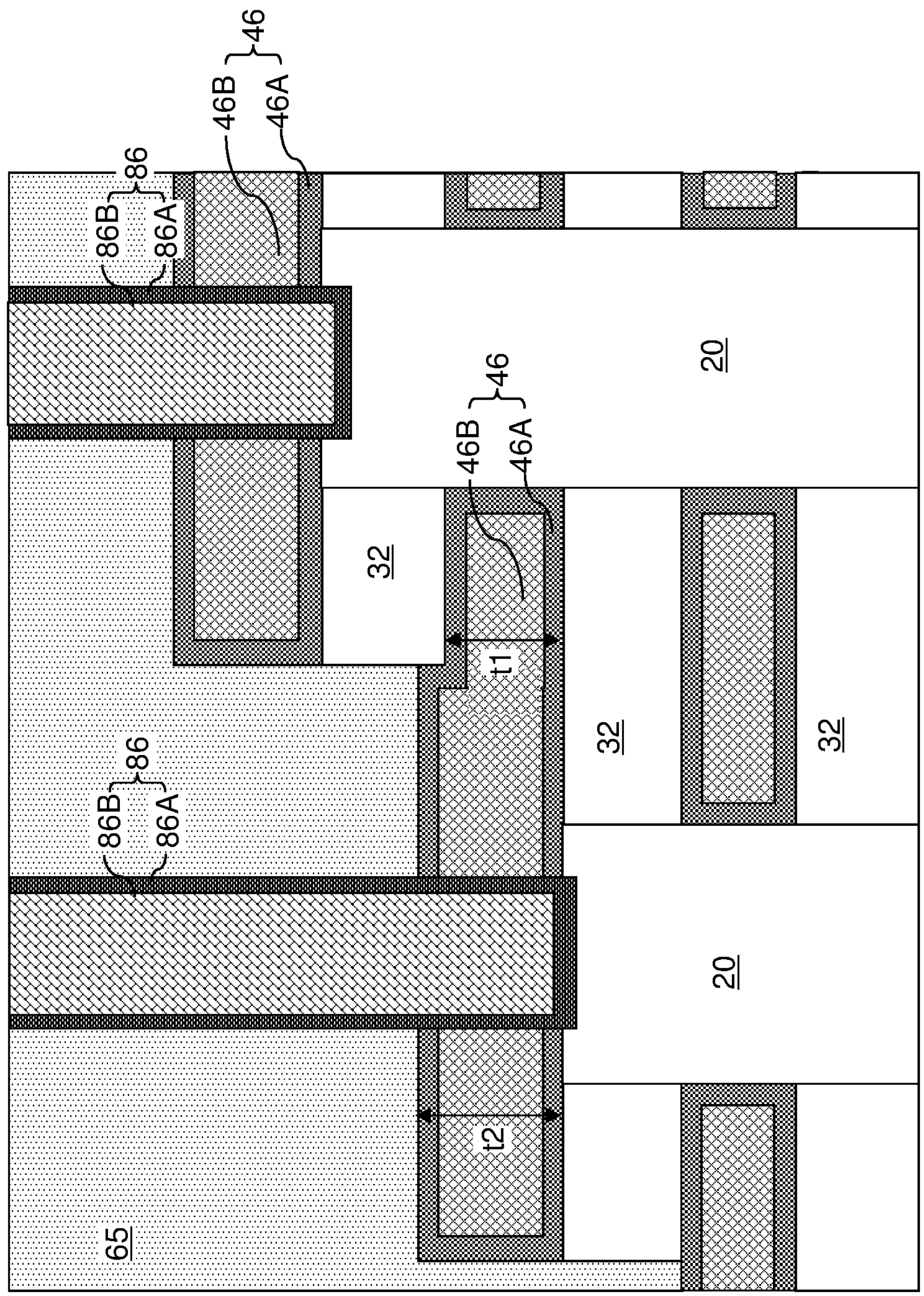
FIG. 22A is a magnified view of a region around a pair of layer-contact via structures in a second alternative configuration of the exemplary structure according to an embodiment of the present disclosure.
Figure 22B:
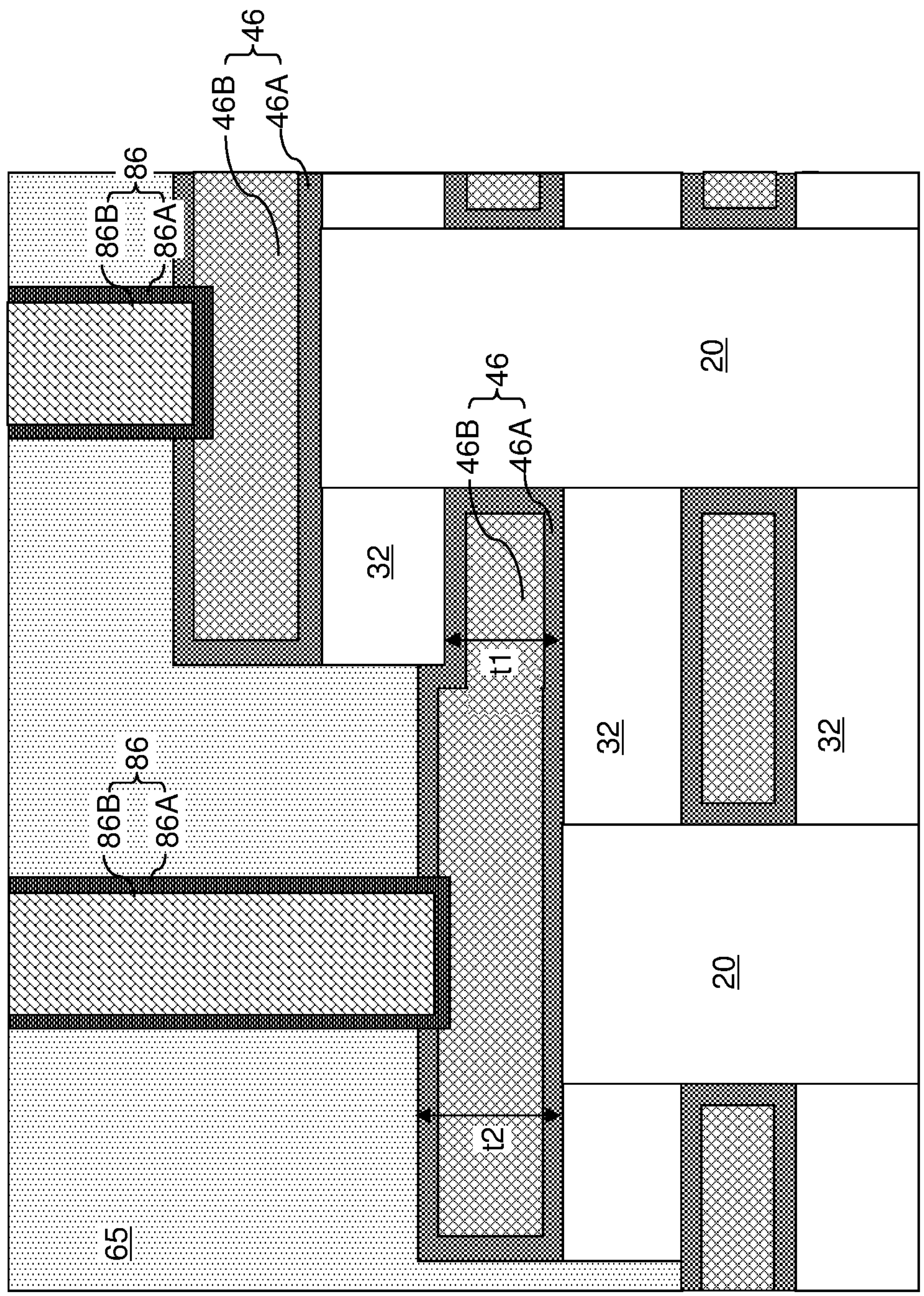
FIG. 22B is a magnified view of a region around another pair of layer-contact via structures in the second alternative configuration of the exemplary structure according to an embodiment of the present disclosure.

Referring to FIGS. 22A and 22B, a second alternative configuration of the exemplary structure may be derived from the exemplary structure of FIGS. 20A-20E by omitting formation of backside blocking dielectric layers 44. In one embodiment, the second thickness t2 is greater than the first thickness t1.

Figure 23A:
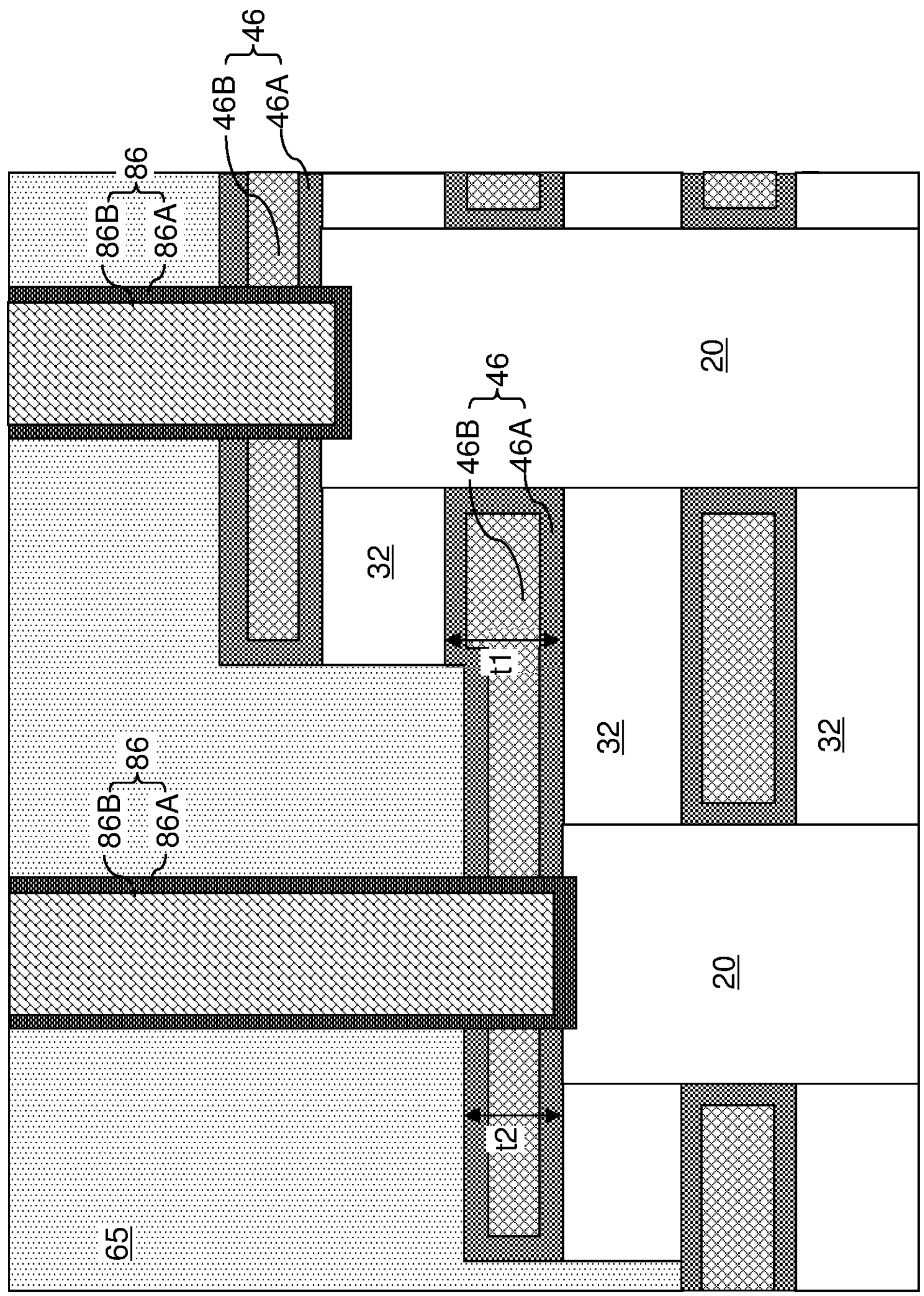
FIG. 23A is a magnified view of a region around a pair of layer-contact via structures in a third alternative configuration of the exemplary structure according to an embodiment of the present disclosure.
Figure 23B:
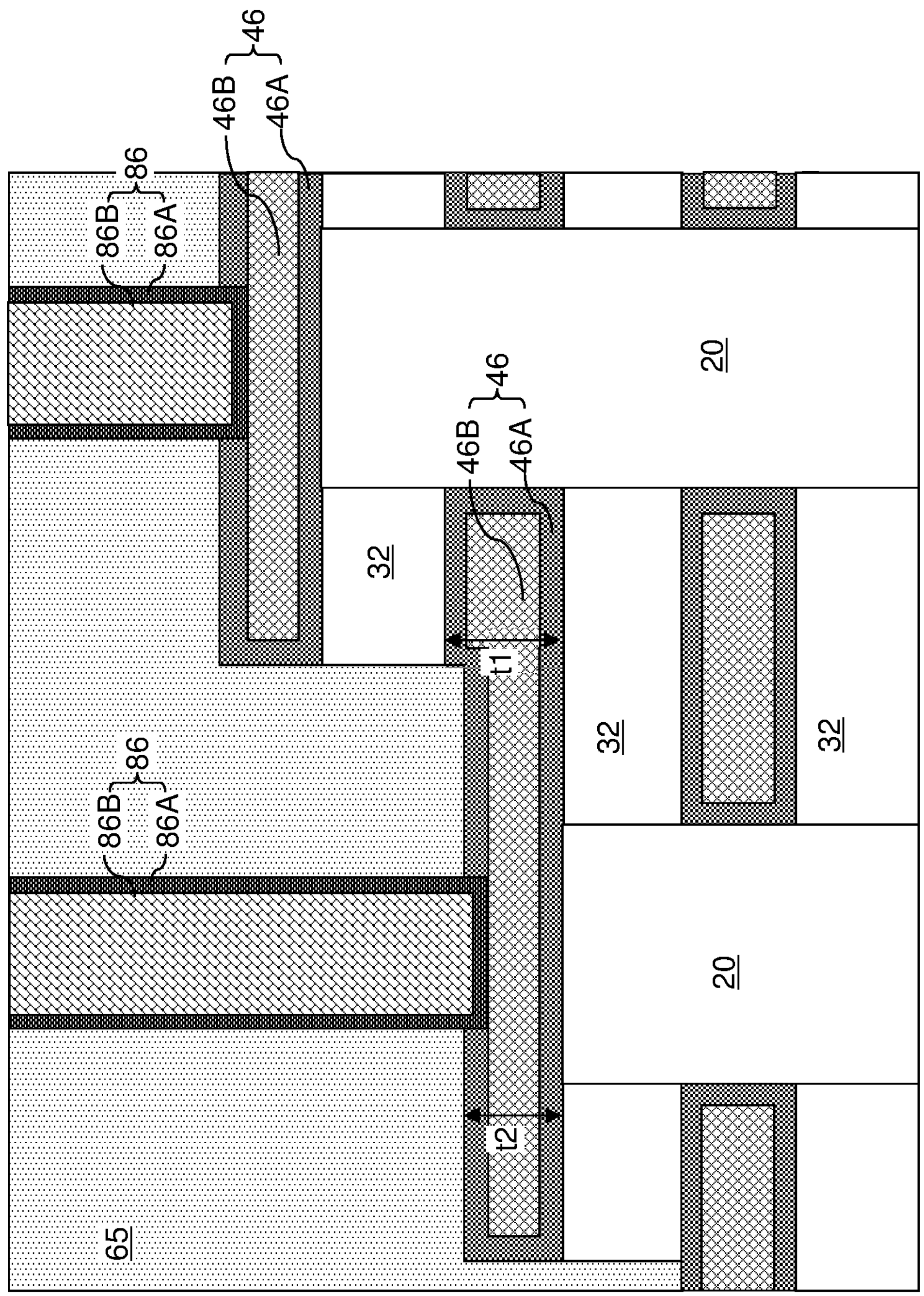
FIG. 23B is a magnified view of a region around another pair of layer-contact via structures in the third alternative configuration of the exemplary structure according to an embodiment of the present disclosure.

Referring to FIGS. 23A and 23B, a third alternative configuration of the exemplary structure may be derived from the first configuration of the exemplary structure illustrated in FIGS. 21A and 21B by omitting formation of the backside blocking dielectric layers 44. In one embodiment, the second thickness t2 is less than the first thickness t1.

Referring to all drawings and according to various embodiments of the present disclosure, a three-dimensional memory device is provided, which comprises: an alternating stack of insulating layers 32 and electrically conductive layers 46 containing stepped surfaces in a staircase region (i.e., contact region 300); memory openings 49 vertically extending through the alternating stack (32, 46); memory opening fill structures 58 located in the memory openings 49, wherein each of the memory opening fill structures 58 comprises a vertical semiconductor channel 60 and a vertical stack of memory elements (such as portions of a memory material layer 54 located at levels of the electrically conductive layers 46); a retro-stepped dielectric material portion 65 overlying a portion of the alternating stack (32, 46) within the staircase region; a first contact via structure 86 vertically extending through the retro-stepped dielectric material portion 65 and contacting a first electrically conductive layer 46 among the electrically conductive layers 46; and a first support pillar structure 20A comprising a dielectric fill material located directly below the first contact via structure 86.

In one embodiment, the first support pillar structure 20A underlies the first electrically conductive layer 46. A periphery of a bottom surface of the first contact via structure 86 is located entirely inside and is laterally offset inward from a periphery of a topmost surface of the first support pillar structure 20A in a plan view along a vertical direction (such as a see-through top-down view). In one embodiment, the alternating stack is located over a substrate (9, 10) and lateral extents of the electrically conductive layers 46 decrease with a vertical distance from the substrate in the staircase region (e.g., contact region 300).

In one embodiment, a cylindrical vertical plane including a sidewall of the first contact via structure 86 is located within, and is laterally offset inward from, a cylindrical vertical plane including a sidewall of the first support pillar structure 20A. In one embodiment, a maximum lateral dimension (such as a diameter) of the first contact via structure 86 is less than a maximum lateral dimension (such as a diameter) of the first support pillar structure 20A.

In one embodiment, an entirety of the first support pillar structure 20A consists essentially of the dielectric fill material. In one embodiment, an entirety of the first support pillar structure 20A is located below a horizontal plane including a bottom surface of the first electrically conductive layer 46. In one embodiment, a bottom surface of the first contact via structure 86 is in direct contact with a recessed surface of the first support pillar structure 20A. In one embodiment, the recessed surface of the first support pillar structure 20A is vertically recessed downward relative to the topmost surface of the first support pillar structure 20A. In one embodiment, the topmost surface of the first support pillar structure 20A has an annular shape having an inner periphery and an outer periphery that is laterally offset outward from the inner periphery.

In one embodiment, the three-dimensional memory device comprises: a second contact via structure 86 vertically extending through the retro-stepped dielectric material portion 65 and contacting a second electrically conductive layer 46 (which is more proximal to the substrate (9, 10) than the first electrically conductive layer 46 is to the substrate (9, 10)) among the electrically conductive layers 46; and a second support pillar structure (i.e., One other first support pillar structure 20A) comprising the dielectric fill material and underlying the second electrically conductive layer. A periphery of a bottom surface of the second contact via structure 86 is located entirely inside, and is laterally offset inward from, a periphery of a topmost surface of the second support pillar structure 20A in the plan view; and the second contact via structure 86 does not contact the second support pillar structure 20A.

In one embodiment, additional contact via structures (such as additional layer-contact via structures 86) vertically extend through the retro-stepped dielectric material portion 65 and contact a respective one of the electrically conductive layers 46 among the electrically conductive layers 46 of the alternating stack (32, 46). Additional support pillar structures (such as the second support pillar structures 20B) vertically extend through the alternating stack (32, 46), and are located in the staircase region and do not contact any of the additional contact via structures (such as the additional layer-contact via structures 86). In one embodiment, one, and/or more, and/or each, of the additional support pillar structures 20B comprises: a semicircular topmost surface; a vertical surface adjoined to a straight edge of the semicircular topmost surface and contacting the retro-stepped dielectric material portion 65; and a semicircular planar surface that is adjoined to a straight bottom edge of the vertical surface and underlying one of the electrically conductive layers 46.

The various embodiments of the present disclosure can be employed to provide robust contact via structures 86 that contact electrically conductive layers 46 that function as word lines and select gate electrodes of a three-dimensional memory device. The contact via structures 86 avoid electrically shorting together multiple electrically conductive layers 46 because a first support pillar structure 20A underlies each portion of the electrically conductive layers 46 that is contacted by a respective contact via structure 86. Therefore, even if the contact via structure 86 extends through a respective electrically conductive layer 46, then the bottom of such contact via structure 86 is embedded in the dielectric first support pillar structure 20A and does not contact or short circuit an underlying electrically conductive layer 46 in the stack. Thus, the structures and methods of the present disclosure can increase the process yield and the reliability of a three-dimensional memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device, comprising:

forming an alternating stack of insulating layers and sacrificial material layers over a substrate;

forming support pillar structures through the alternating stack;

forming stepped surfaces by patterning the alternating stack and the support pillar structures, wherein the stepped surfaces continuously extend from a bottommost layer of the alternating stack to a topmost layer of the alternating stack in a staircase region;

forming a retro-stepped dielectric material portion over the stepped surfaces;

forming memory openings through the alternating stack in a memory array region;

forming memory opening fill structures in the memory openings, wherein each of the memory opening fill structures comprises a vertical semiconductor channel and a vertical stack of memory elements;

forming electrically conductive layers by replacing at least the sacrificial material layers with at least one electrically conductive material; and forming contact via structures through the retro-stepped dielectric material portion in contact with the electrically conductive layers, wherein a first support pillar structure of the support pillar structures is located directly below a first contact via structure of the contact via structures; and wherein the first contact via structure has a bottom surface that is located entirely inside and is laterally offset inward from a periphery of a topmost surface of the first support pillar structure in a plan view along a vertical direction.

2. A method of forming a three-dimensional memory device, comprising:

forming an alternating stack of insulating layers and sacrificial material layers over a substrate;

forming support pillar structures through the alternating stack;

forming stepped surfaces by patterning the alternating stack and the support pillar structures, wherein the stepped surfaces continuously extend from a bottommost layer of the alternating stack to a topmost layer of the alternating stack in a staircase region;

forming a retro-stepped dielectric material portion over the stepped surfaces;

forming memory openings through the alternating stack in a memory array region;

forming memory opening fill structures in the memory openings, wherein each of the memory opening fill structures comprises a vertical semiconductor channel and a vertical stack of memory elements;

forming electrically conductive layers by replacing at least the sacrificial material layers with at least one electrically conductive material;

forming contact via cavities through the retro-stepped dielectric material portion; and forming contact via structures through the retro-stepped dielectric material portion in contact with the electrically conductive layers, wherein:

a first support pillar structure of the support pillar structures is located directly below a first contact via structure of the contact via structures;

a first contact via cavity of the contact via cavities vertically extends through a first electrically conductive layer of the electrically conductive layers and into a top portion of the first support pillar structure; and the first contact via structure is formed in the first contact via cavity directly on the first support pillar structure.

3. The method of claim 2, wherein:

a second contact via cavity of the contact via cavities vertically extends into a second electrically conductive layer of the electrically conductive layers;

a bottom surface of the second contact via cavity is located entirely inside and is laterally offset inward from a periphery of a topmost surface of a second support pillar structure of the support pillar structures in the plan view; and the bottom surface of the second contact via cavity is located above a horizontal plane including a bottom surface of the second electrically conductive layer.

* * * * *